(12) United States Patent
Wakimoto et al.

(10) Patent No.: US 8,008,734 B2
(45) Date of Patent: Aug. 30, 2011

(54) POWER SEMICONDUCTOR DEVICE

(75) Inventors: Hiroki Wakimoto, Matsumoto (JP);
Masahito Otsuki, Matsumoto (JP);
Takashi Shiigi, Matsumoto (JP)

(73) Assignee: Fuji Electric Co., Ltd. (JP)

( * ) Notice: Subject to any disclaimer, the term of this patent is extended or adjusted under 35 U.S.C. 154(b) by 660 days.

(21) Appl. No.: 11/972,932

(22) Filed: Jan. 11, 2008

(65) Prior Publication Data
US 2008/0169526 A1 Jul. 17, 2008

(30) Foreign Application Priority Data

Jan. 11, 2007 (JP) ................................. 2007-003579
Aug. 9, 2007 (JP) ................................. 2007-207560

(51) Int. Cl.
*H01L 29/66* (2006.01)
(52) U.S. Cl. ................. 257/409; 257/127; 257/490
(58) Field of Classification Search .................. 257/127, 257/409, 484, 490
See application file for complete search history.

(56) References Cited

U.S. PATENT DOCUMENTS

| 6,576,955 | B2 | 6/2003 | Kubo | |
| 6,670,650 | B2 * | 12/2003 | Nemoto et al. | 257/144 |
| 6,992,362 | B2 * | 1/2006 | Pernyeszi | 257/500 |
| 7,304,356 | B2 * | 12/2007 | Takahashi | 257/401 |
| 7,521,755 | B2 * | 4/2009 | Takahashi | 257/330 |
| 2002/0190340 | A1 * | 12/2002 | Moriguchi et al. | 257/484 |
| 2006/0131685 | A1 * | 6/2006 | Watanabe et al. | 257/483 |
| 2007/0057280 | A1 * | 3/2007 | Hayashi et al. | 257/127 |
| 2007/0069323 | A1 * | 3/2007 | Kunori et al. | 257/490 |
| 2007/0158691 | A1 * | 7/2007 | Maki et al. | 257/211 |
| 2009/0072340 | A1 * | 3/2009 | Zhang et al. | 257/490 |

FOREIGN PATENT DOCUMENTS

| JP | 2002-50760 A | 2/2002 |
| JP | 3-591301 B2 | 9/2004 |

OTHER PUBLICATIONS

First Office issued in corresponding Chinese Patent Application No. 200810003433.7 dated Jun. 11, 2010. Japanese translation of Chinese action provided, English translation of Japanese translation provide.

* cited by examiner

*Primary Examiner* — Allan R Wilson
(74) *Attorney, Agent, or Firm* — Rossi, Kimms & McDowell LLP

(57) ABSTRACT

A power semiconductor device is provided having a field plate that employs a thick metal film in an edge termination structure and which permits edge termination structure width reduction even with large side etching or etching variation, which exhibits superior long-term forward blocking voltage capability reliability, and which allows minimal forward blocking voltage capability variation. The edge termination structure has multiple ring-like p-type guard rings, a first insulating film covering the guard rings, and ring-like field plates, provided via the first insulating film atop the guard rings. The field plates have a polysilicon film and a thicker metal film. The polysilicon film is provided on a first guard ring via first insulating film, and a dual field plate made of the polysilicon film and metal film is provided on a second guard ring. The dual field plate is stacked via a second insulating film. The first and second guard rings alternate.

19 Claims, 19 Drawing Sheets

POWER SEMICONDUCTOR DEVICE

BACKGROUND

The present invention relates to a power semiconductor device which is used in a power converter or the like.

An essential part cross-sectional view of an active region 20 in which a main current flows in the center of a conventional power semiconductor device and an edge termination structure section 30 that is located at the circumference that encloses the active region 20 is shown in FIG. 14. The edge termination structure section 30 is a part that is provided to reliably hold this OFF-state voltage between the upper and lower electrodes (the lower electrode is not illustrated) of an n-type semiconductor substrate 100 of the device in an OFF state. As the OFF-state voltage increases, there is a need to increase width of the edge termination structure section 30 (the width of the edge termination structure section 30 in a direction extending from the boundary with the active region 20 toward the outer edge of the semiconductor substrate 100). However, because the width of the edge termination structure section 30 is large and the occupied surface area thereof is also large, the surface area of the active region 20 in which the main current of the device flows undergoes a relative decrease. The edge termination structure section 30 is therefore desirably as small as possible.

In the case of the edge termination structure section 30 of a conventional planar semiconductor device, not only is a local concentration of the internal electric field prevented in order to secure the rated forward blocking voltage capability, but a boundary relaxation structure such as a guard ring 40 and field plate 80 or the like is sometimes also provided with the objective of improving the forward blocking voltage capability. Of these boundary relaxation structures, the field plate 80 often employs a metal film of the same type which is formed at the same time as the metal electrode 90, such as an emitter electrode, cathode electrode or the like, which is in contact with a p-type well 70 that is formed on the surface side of the active region 20 of the semiconductor device for the sake of efficiency in the fabrication process. Such a metal film includes an Al thin film or the like to which a minute amount of Si, for example, has been added. Because the thickness of the metal film is from 3 μm to 5 μm in a power semiconductor device, the required emitter and field plate pattern are processed by means of wet etching, which uses a photo process, rather than dry etching. Other field plate materials which can be used are conductive silicon film, and semi-insulating thin film, and so forth.

In addition to improving the forward blocking voltage capability resulting from the electric field relaxation effect, the field plate 80 which employs a metal film of this kind also possesses a function for maintaining long-term reliability of the forward blocking voltage capability function by shielding unnecessary charge (referred to as 'external charge' hereinbelow) which is harmful and applied from the external environment to the insulating film on the surface of the edge termination structure and the atmosphere external to the device.

A semiconductor device in which edge termination structures that alternately comprise an electrically conductive field plate and a semi-insulating field plate is well known. Such a semiconductor device has a stable high forward blocking voltage capability, even when the surface area occupied by the edge termination structure is small. Japanese Patent Registration No. 3591301 is a well-known document relating to the field plate technology for a power semiconductor device.

However, as mentioned earlier, because the required pattern is processed by wet-etching a metal film that has a relatively large film thickness, with the field plate that is conventionally applied to a power semiconductor element, the amount of side etching of the metal film is large. Because it is necessary to anticipate each of the widths indicated by the arrows in FIG. 14 in the design by taking the width corresponding with this large amount of side etching as the design margin, it is difficult to shorten the edge termination structure. In addition, scatter readily occurs in the initial characteristic of the device forward blocking voltage capability because, in comparison with dry etching, wet etching has a low etching accuracy due to the large scatter in the etching amounts and so forth.

SUMMARY OF THE INVENTION

In view of the above it would be preferable to provide a power semiconductor device which permits a reduction of the width of the edge termination structure, exhibits superior long-term forward blocking voltage capability reliability, and allows scatter of the forward blocking voltage capability characteristic to be minimized. Preferably, these characteristics would be provided even when the edge termination structure of the power semiconductor device comprises a field plate that employs a metal film for a relatively thick metal electrode, and in cases of a large side etching amount or etching amount scatter when a field plate of a predetermined pattern is processed by wet-etching the metal film that is attached to the whole surface.

This is achieved by a power semiconductor device comprising: a region of another conductivity type in a semiconductor substrate surface layer of a first conductivity type; an active region having a metal electrode that contacts the region of another conductivity type; and an edge termination structure that surrounds the active region. The edge termination structure has a plurality of ring-like other conductivity type guard rings, a first insulating film that covers a surface of the edge termination structure, and ring-like field plates each provided via the first insulating film atop the plurality of ring-like other conductivity type guard rings. The ring-like field plates comprise a first field plate comprising a conductive thin film, and a second field plate comprising a metal film. The plurality of ring-like other conductivity type guard rings comprise a first ring-like other conductivity type guard ring on which the first field plate is provided via the first insulating film, and a second ring-like other conductivity type guard ring on which a dual field plate comprising the first field plate and the second field plate, which is provided via a second insulating film atop the first field plate.

In a further preferred embodiment of the invention, the first field plate in the dual-layer field plate has a larger width than the second field plate in a direction that intersects the ring shape of the field plate at right angles.

In a further preferred embodiment of the invention, a contact portion is provided in at least one location in each of the plurality of ring-like other conductivity type guard rings. The contact portion establishes contact at the same potential between the plurality of ring-like other conductivity type guard rings, the first field plate, and the second field plate.

In a further preferred embodiment of the invention, the contact portion is formed by a structure that covers the second field plate by embedding the second field plate in an etching hole that penetrates the second insulating film, the first field plate, and the first insulating film and reaches the surface of the ring-like other conductivity type guard rings such that the etching aperture diameter in the second insulating film is larger than the etching aperture diameter of the first field plate.

In a further preferred embodiment of the invention, the contact portion is provided in corner portions of the edge termination structure which surrounds the active region. The contact portion comprises four linear sides and the corner portions which link the four sides in an arc shape.

In a further preferred embodiment of the invention, the width of the arc-like part of the plurality of ring-like other conductivity type guard rings located in the corner portions of the edge termination structure is greater than the width of the four linear side parts of the edge termination structure.

In a further preferred embodiment of the invention, the contact portion is constituted by at least one of the two alternatives below. A first contact portion covers the second field plate by embedding the second field plate in an etching hole that penetrates the second insulating film, the first field plate, and the first insulating film and reaches a surface of the ring-like other conductivity type guard rings. The etching aperture diameter in the second insulating film is smaller than the etching aperture diameter of the first field plate. Alternatively, a second contact portion comprises the first insulating film, the first field plate, and the second insulating film on the surface of the ring-like other conductivity type guard rings, and covers the second field plate by embedding the second field plate in an etching hole via which only the second insulating film is open.

In a further preferred embodiment of the invention, the first field plate is formed by polycrystalline silicon with a low resistance afforded through ion implantation or gas doping.

In a further preferred embodiment of the invention, the second field plate is formed by means of the same type of metal film as the metal electrode that is formed in the active region.

In a further preferred embodiment of the invention, the first insulating film is a thermally oxidized film.

In a further preferred embodiment of the invention, the second insulating film is an insulating film that is deposited by means of chemical vapor deposition.

In a further preferred embodiment of the invention, the second insulating film is formed by oxidizing the first field plate that is formed from polycrystalline silicon.

In a further preferred embodiment of the invention, a region in which the surface of the first field plate is exposed is provided in the center of the surface of the ring-like other conductivity type guard rings in the etching hole that is formed in the contact portion.

In a further preferred embodiment of the invention, the contact portion is provided in the corner portion of the edge termination structure which surrounds the active region, and comprises four linear sides and corner portions which link the four sides in an arc shape.

In a further preferred embodiment of the invention, the width of the arc-like part of the plurality of ring-like other conductivity type guard rings located in the corner portions of the edge termination structure is greater than the width of the four linear side parts of the edge termination structure.

In a further preferred embodiment of the invention, the contact portion is constituted by at least one of the two alternatives below. A first contact portion covers the second field plate by embedding the second field plate in an etching hole that penetrates the second insulating film, the first field plate, and the first insulating film and reaches a surface of the ring-like other conductivity type guard rings. The etching aperture diameter in the second insulating film is smaller than the etching aperture diameter of the first field plate. Alternatively, a second contact portion comprises the first insulating film, the first field plate, and the second insulating film on the surface of the ring-like other conductivity type guard rings, and covers the second field plate by embedding the second field plate in an etching hole via which only the second insulating film is open.

In a further preferred embodiment of the invention, the first field plate is formed from polycrystalline silicon with a low resistance afforded through ion implantation or gas doping.

In a further preferred embodiment of the invention, the second field plate is formed by means of the same type of metal film as the metal electrode that is formed in the active region.

In a further preferred embodiment of the invention, the first insulating film is a thermally oxidized film.

In a further preferred embodiment of the invention, the second insulating film is an insulating film that is deposited by means of chemical vapor deposition.

In a further preferred embodiment of the invention, the second insulating film is formed by oxidizing the first field plate that is formed from polycrystalline silicon.

The present invention makes it possible to provide a power semiconductor device which permits a reduction of the width of the edge termination structure, exhibits superior long-term forward blocking voltage capability reliability, and allows scatter of the initial forward blocking voltage capability characteristic to be minimized. These advantages are possible even when the edge termination structure of the power semiconductor device comprises a field plate that employs a metal film for a relatively thick metal electrode, or in cases of a large side etching amount or etching amount scatter when a field plate of a predetermined pattern is processed by wet-etching the metal film that is attached to the whole surface.

BRIEF DESCRIPTION OF THE DRAWINGS

The invention will be described with respect to certain preferred embodiments and the accompanying drawings, wherein.

DESCRIPTION OF THE PREFERRED EMBODIMENTS

Figure 5A:
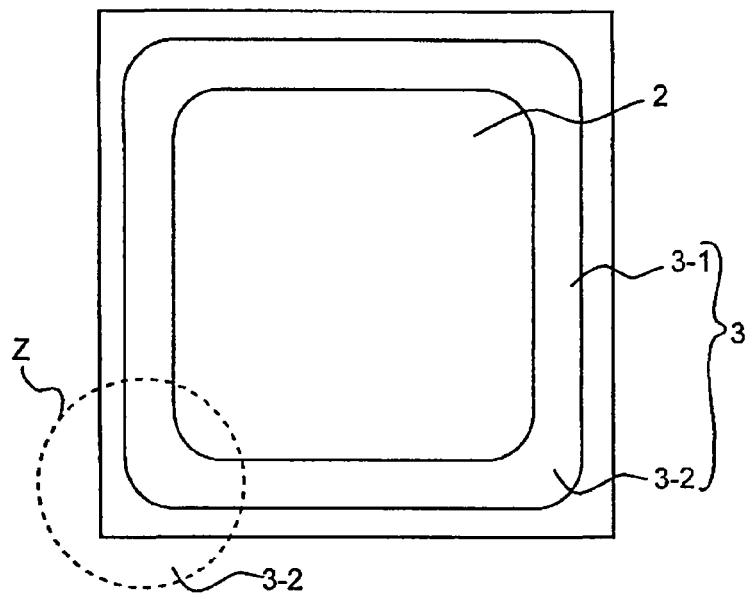
FIG. 5A is a planar view of the power semiconductor device of the present invention and FIG. 5B is a (first) planar view of the edge termination structure in the corner portion inside the circular dotted line of FIG. 5A.
Figure 5B:
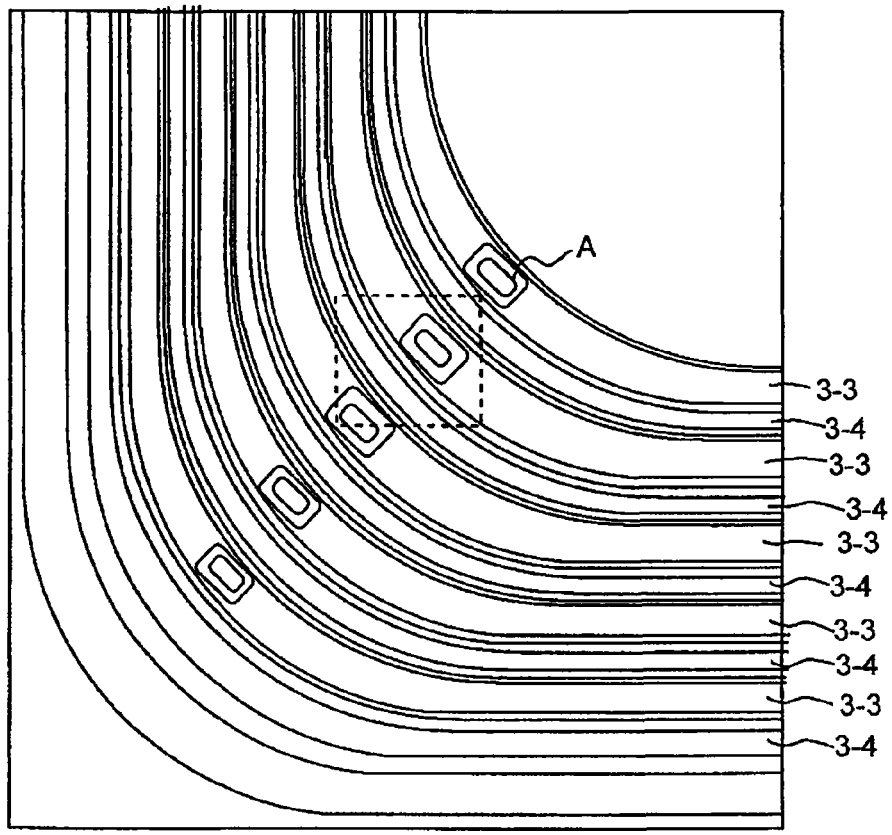
Figure 6A:
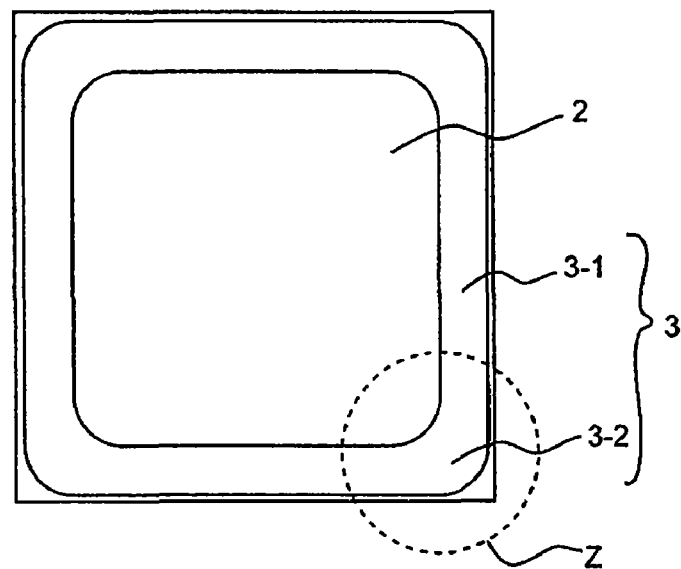
FIG. 6A is a planar view of the power semiconductor device of the present invention and FIG. 6B is a (second) planar view of the edge termination structure in the corner portion inside the circular dotted line of FIG. 6A.
Figure 6B:
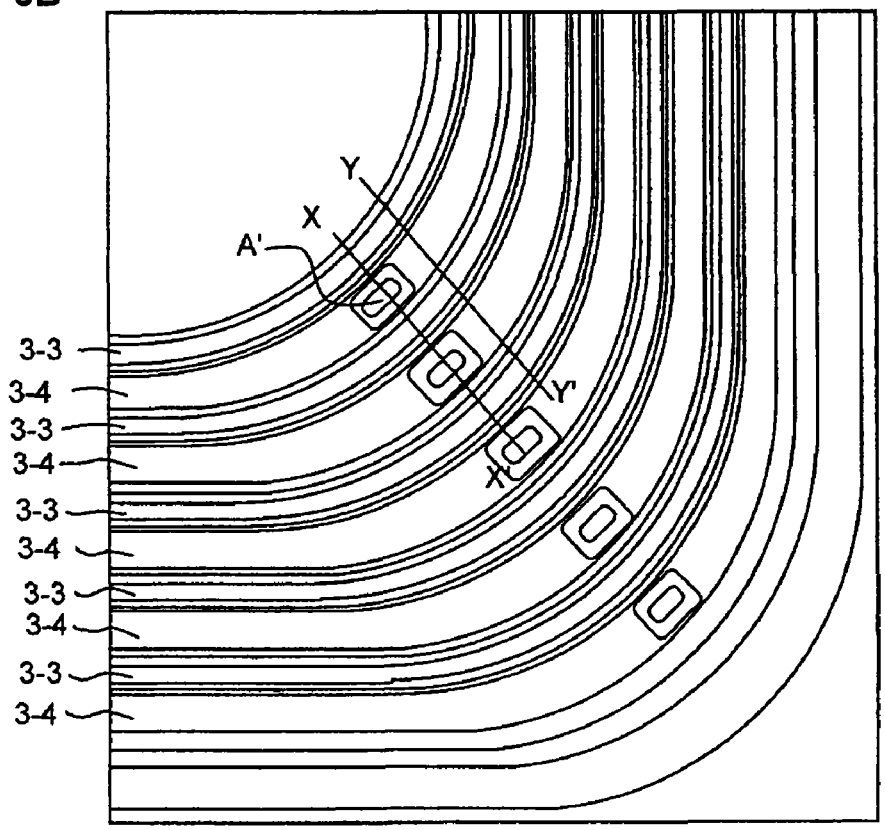
Figure 15:
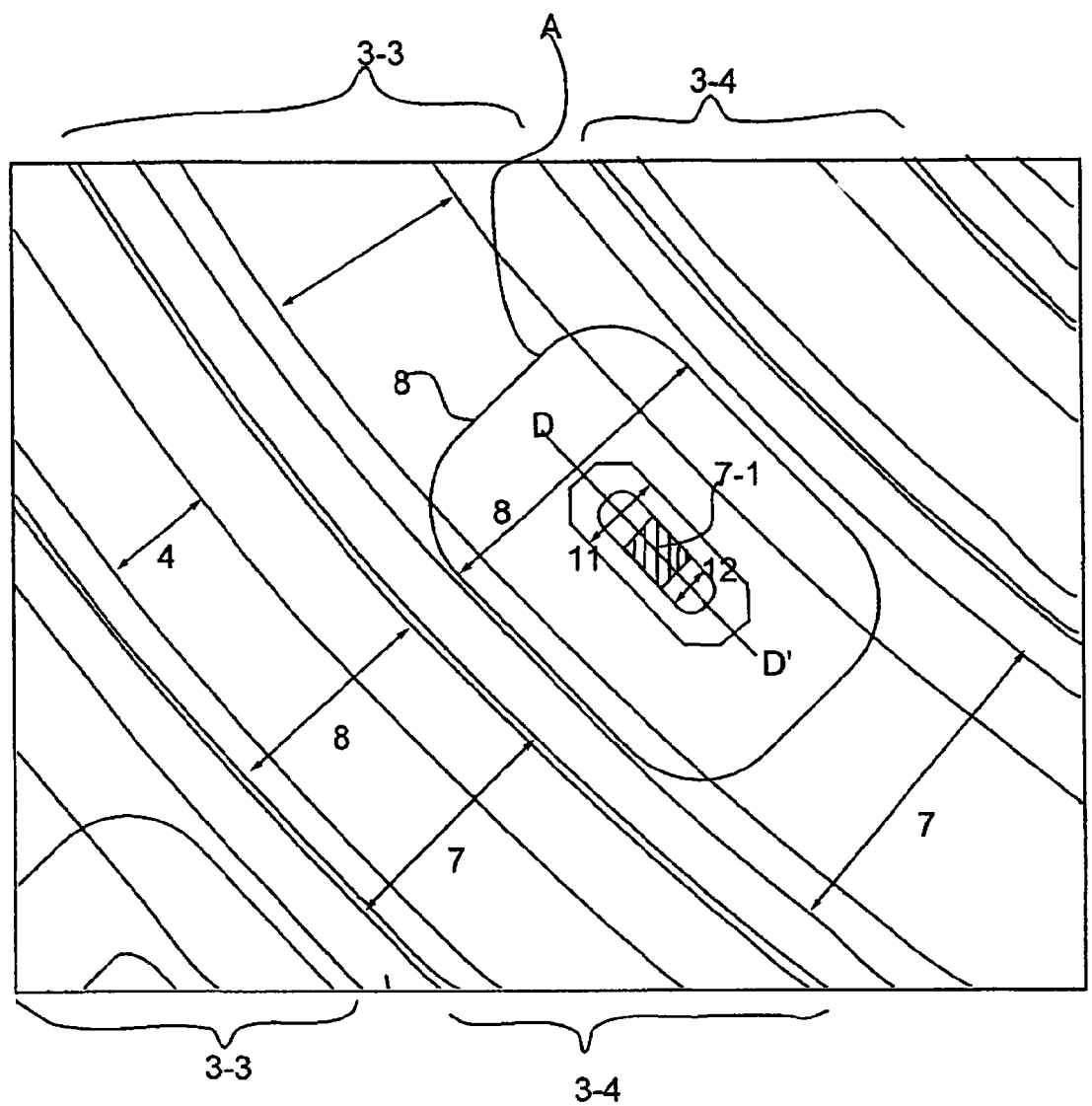
FIG. 15 is a (fifth) planar view of the edge termination structure in the corner portion of the power semiconductor device of the present invention.

FIGS. 1 to 4 are planar views of different edge termination structures of the power semiconductor device of the present invention. FIGS. 5 to 7 are cross-sectional views of different edge termination structures in the corner portion of the power semiconductor device of the present invention. FIG. 8 is an enlarged cross-sectional view of the edge termination structure in the corner portion of the power semiconductor device of the present invention. FIGS. 9 to 12 are cross-sectional views along the line X-X' of the edge termination structure of FIG. 6B which serves to illustrate the method of fabricating the power semiconductor device of the present invention. FIG. 13 is a cross-sectional view along the line Y-Y' of FIG. 6B which shows a non-contact portion of the edge termination structure in the corner portion of the power semiconductor device of the present invention. FIG. 15 is a (fifth) planar view B of the edge termination structure in the corner portion of the power semiconductor device of the present invention. FIGS. 16-19 are cross-sectional views along the line D-D' in FIG. 15 according to the present invention.

Figure 1:
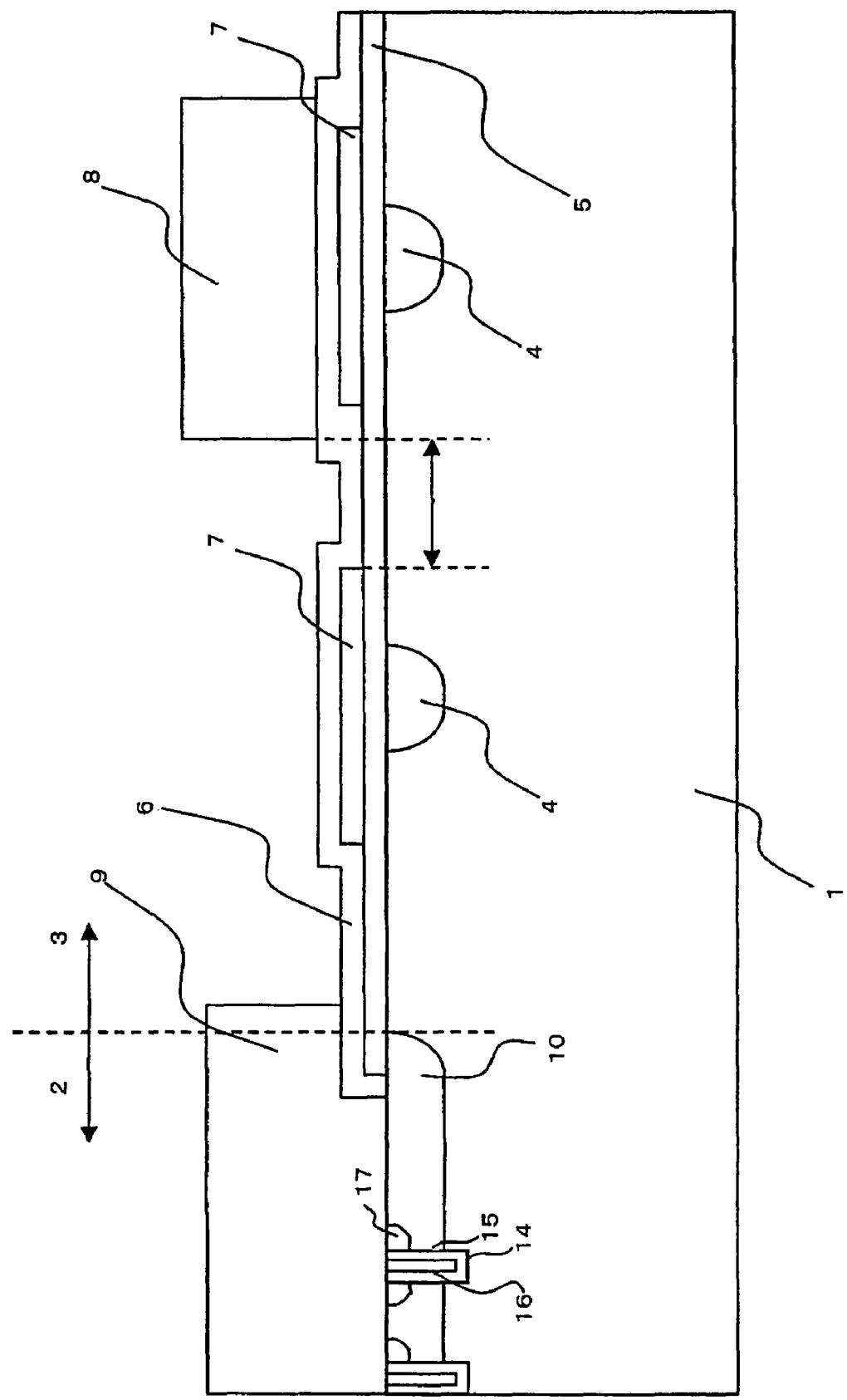
FIG. 1 is a first essential part cross-sectional view of the edge termination structure of the power semiconductor device.

FIG. 1 is an essential part cross-sectional view of the power semiconductor device of the present invention which shows an example of an edge termination structure. The structure is located at the circumference surrounding the active region disposed in the center of a first main surface of a square silicon substrate (chip) of a predetermined size. The chip is cut in lattice form from a disc-shaped semiconductor substrate. An edge termination structure 3 of the present invention is a diffusion layer that is formed by diffusing impurities into the surface layer of an n-type semiconductor substrate 1. The edge termination structure 3 comprises a plurality of p-type guard rings 4 which are arranged with a planar shape in the form of a plurality of rings within the edge termination structure 3 that surrounds the active region 2, a first insulating film 5 that is formed on the surface of the edge termination structure 3 and, atop the first insulating film, field plates 7 and 8 which comprise a metal film or an electrically conductive thin film.

This embodiment shows a vertical trench MOSFET structure as the active region 2. A trench MOSFET comprises a trench 14 that penetrates a p-type well region 10 and reaches an n-type semiconductor substrate 1. A gate electrode 16 consisting of polysilicon is provided via a gate insulating film 15 inside the trench 14. An n+source region 17 is provided inside the p-type well region 10 at the upper end of the wall of the trench 14. Because the present invention is characterized by the edge termination structure 3, a detailed description of the active region 2 and n-type semiconductor substrate 1 is omitted. In reality, an n+high concentration layer is provided on the underside of the n-type semiconductor substrate 1 in the case of a MOSFET and an n+high concentration layer and a p-type collector layer are provided on the underside of the n-type semiconductor substrate 1 in the case of an IGBT.

The edge termination structure has field plates of two types, namely, a first field plate 7 and a second field plate 8 which have different materials and different creation methods. The field plates which are disposed on the plurality of p-type guard rings 4 of a ring-like planar shape have a constitution part whereon only the first field plate 7 is mounted and a constitution part whereon a dual-stacked layer field plate structure consisting of the first field plate 7 and the second field plate 8 which is laminated via a second insulating film 6 atop the first field plate 7 is mounted. The first field plate 7 is a thin, electrically conductive film of high etching accuracy and the second field plate 8 is thicker than the first field plate 7 and consists of a metal film of an etching accuracy that is relatively lower than that of the first field plate 7. The metal film preferably consists of a metal film of the same type which is formed at the same time as the formation of the metal film 9 which constitutes the main electrode in contact with the surface of the p-type well region 10 of the active region 2.

The power semiconductor device of the present invention is characterized by comprising an edge termination structure 3 in which ring-like p-type guard rings 4 are alternately layered. The first field plate 7 and the dual layer field plates 7 and 8 are mounted thereon. With the ring-like p-type guard rings 4 of the edge termination structure 3, the surface interval from the second field plate 8 of a thick metal film at the surface can be increased to an extent where its influence can be ignored even when the side etching amount of the material forming the field plate is increased. Hence, the design margin can be afforded scope and the width of the edge termination structure 3 can be decreased.

If the width of the second field plate 8 is smaller than the first field plate 7 of the dual-stacked layer field plate structure in a direction that intersects the ring-like guard rings 4 at right angles at the surface of the edge termination structure 3, the forward blocking voltage capability is mainly determined by the first field plate 7. The first field plate 7 can be thinner so that the side etching amount is reduced and therefore has a stable forward blocking voltage capability characteristic. In this case, the second field plate 8 affords a field effect that prevents deterioration of the forward blocking voltage capability caused by external charge.

Figure 2:
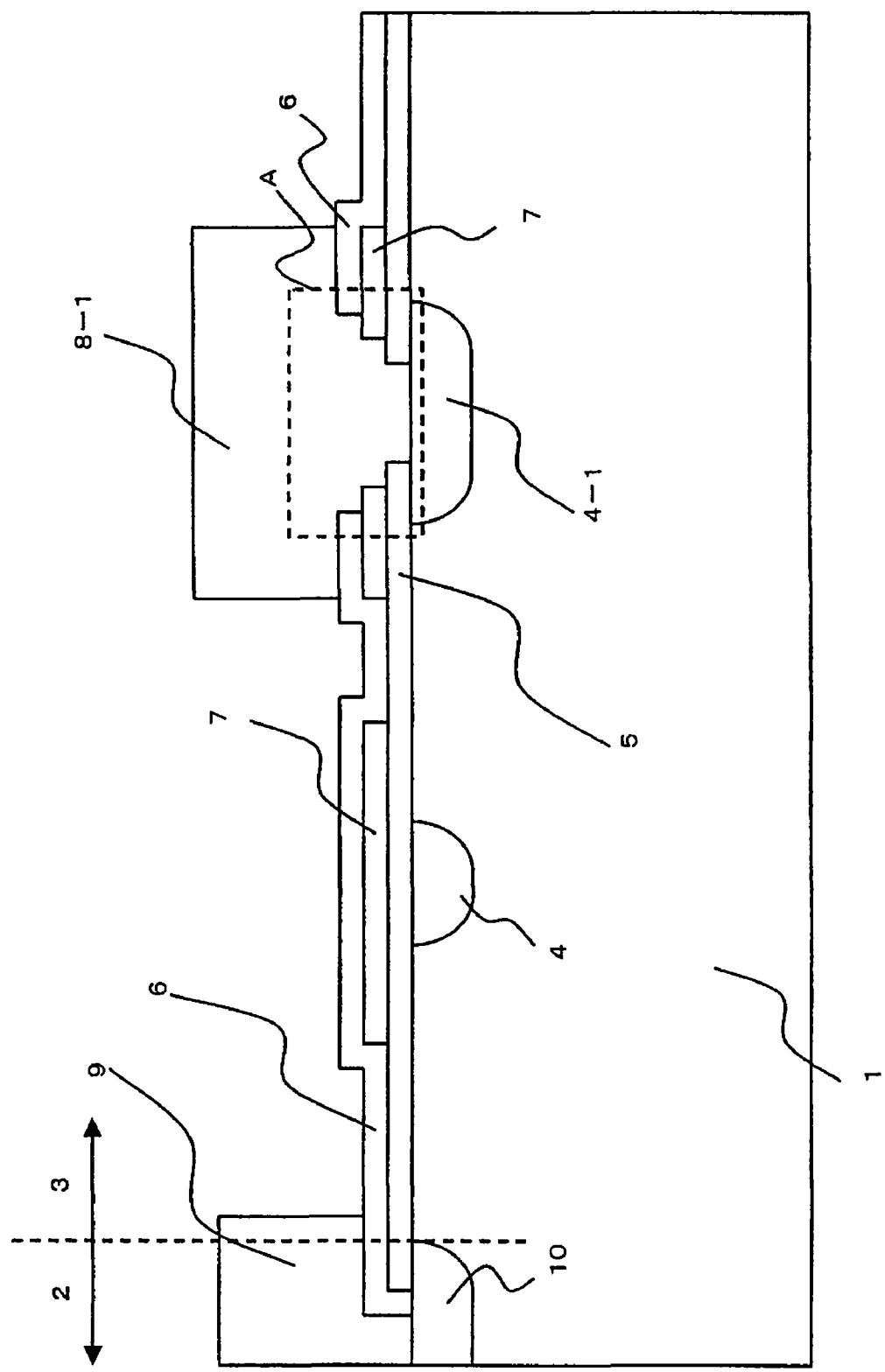
FIG. 2 is a second essential part cross-sectional view of the edge termination structure of the power semiconductor device.

FIG. 2 is a cross-sectional view of the same edge termination structure as FIG. 1, except that the location of the cross-section is different. This is an essential part cross-sectional view that is cut in a position that includes the conductive connection points between the field plates and the guard rings. A description of the detailed structure of the active region in FIG. 2 and subsequent drawings is omitted. The part circled by a dotted line in FIG. 2 indicates a contact portion A for a conductive connection via a small-area part 4-1 between the second field plate 8-1, the first field plate 7, and the p-type guard ring surface. An etching hole that penetrates the insulating films 5 and 6 and the field plate 7 is embedded in the second field plate 8-1. The small-area part 4-1 of this p-type guard ring signifies a surface part in which there is a mutual conductive connection within the contact portion A in the ring-like p-type guard ring.

The method of forming the contact portion A involves forming a contact hole by using dry etching to form an etching hole that extends from the surface of the second insulating film 6, penetrates the first field plate 7 and first insulating film 5, and reaches the p-type guard ring small-area part 4-1 in the contact portion A. By embedding this contact hole with Al—Si by means of sputtering to create the second field plate 8-1, a contact portion A is created that conductively connects the second field plate 8-1, first field plate 7, and p-type guard-ring small-area part 4-1. Thereupon, the conductive connection between the second field plate 8-1 and first field plate 7 is implemented by making the aperture diameter of the contact hole of the second insulating film (interlayer insulating film) 6 larger than the aperture diameter of the first field plate 7, thereby permitting a more stable high edge termination structure. The contact portion A is not provided over the whole circumference within the respective p-type guard rings 4. It is provided at one point only in any small-area part within the ring. However, because the guard ring width of the part without the contact portion A in the edge termination structure can be reduced, this contact portion A is preferable. In FIG. 2, parts other than the contact portion A are the same as those of FIG. 1 and a description thereof will therefore be omitted.

Figure 3:
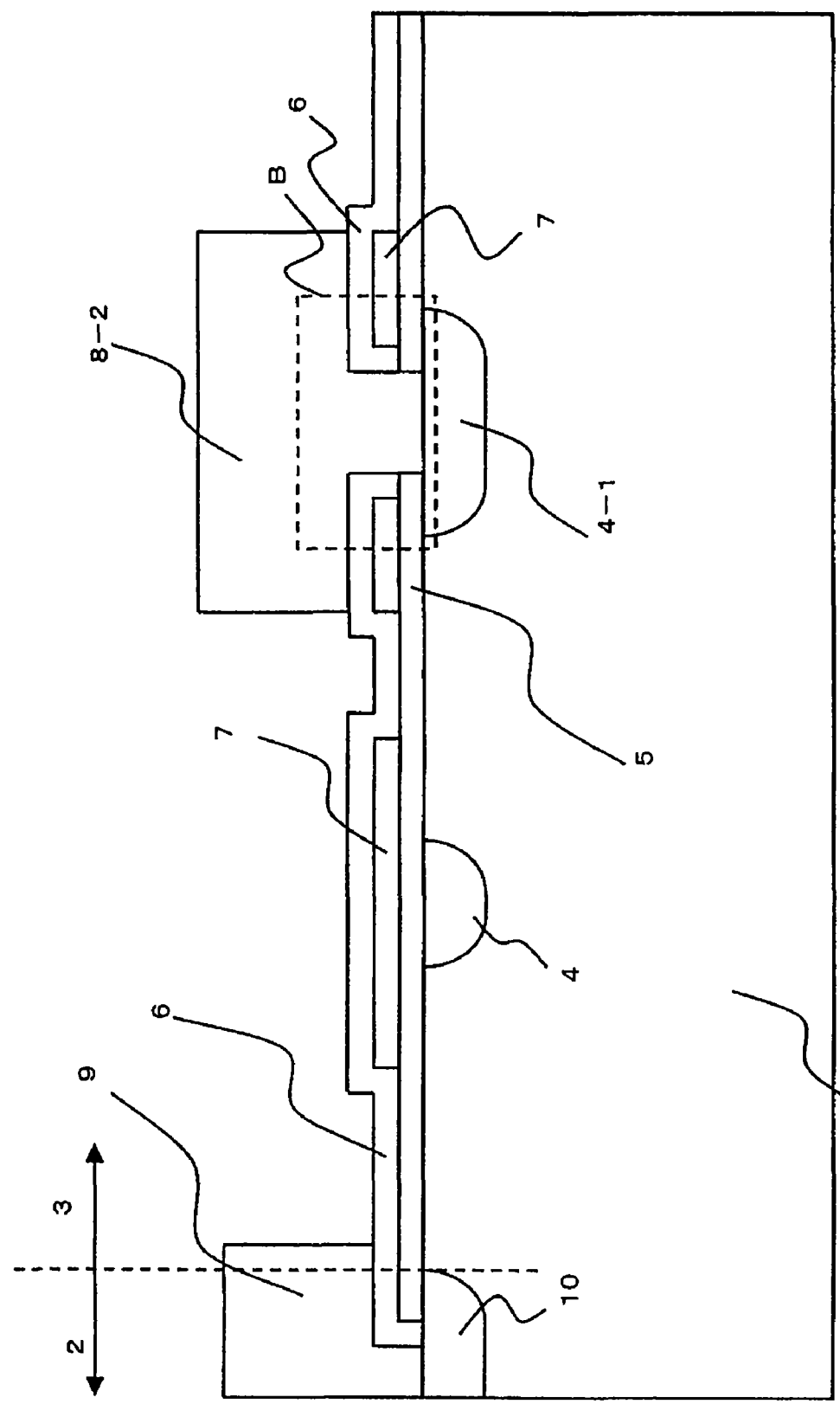
FIG. 3 is a third essential part cross-sectional view of the edge termination structure of the power semiconductor device.

FIG. 3 is a cross-sectional view of the same part of the edge termination structure as FIG. 2 of the power semiconductor device of the present invention. However, this is an essential part cross-sectional view for a case with a different contact portion B. The contact portion B which is circled by a dotted line in FIG. 3 represents a case where the aperture diameter of the contact hole in the second insulating film (interlayer insulating film) 6 is smaller than that in the first field plate 7. For, the contact portion B, only the p-type guard ring small-area part 4-1 and the second field plate 8-2 are in contact. The other parts of FIG. 3 are the same as those of FIG. 2 and a description thereof will therefore be omitted.

Figure 4:
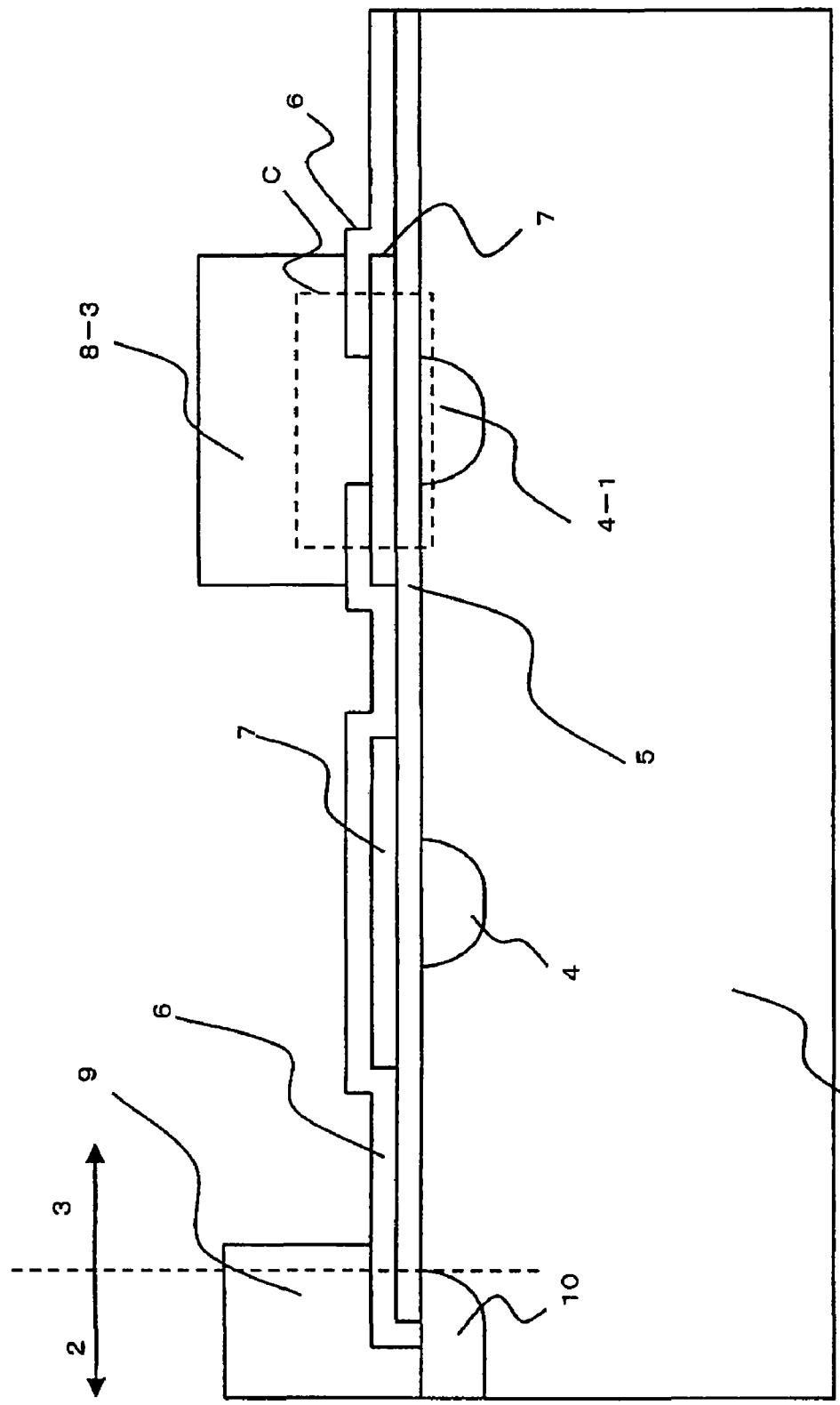
FIG. 4 is a fourth essential part cross-sectional view of the edge termination structure of the power semiconductor device.

FIG. 4 is a cross-sectional view of the edge termination structure part which is the same as that of FIG. 2 for the power semiconductor device of the present invention but this is an essential part cross-sectional view with a different contact portion C. The contact portion C circled by the dotted line in FIG. 4 forms a contact hole only in the second insulating film (interlayer insulating film) 6. Only the first field plate 7 and second field plate 8-3 are placed in contact with one another. When the contact portion B and contact portion C are disposed in at least one location within one ring-like p-type guard ring, an edge termination structure is produced with the same stability as in a case where the contact portion A. This is because the p-type guard ring 4-1 and the first field plate 7 and second field plate 8-3 are at the same potential.

Because the second field plates 8-1 and 8-2 must be connected to the p-type guard ring small-area part 4-1, the contact portion A or contact portion B must possess a width of a certain magnitude. Therefore, in order to permit such connections, the width of the p-type guard ring part having the contact portion A or B is preferably afforded a larger width (the width in the direction that intersects the ring-like guard ring at right angles) than that of the other guard ring parts. As a result, in an edge termination structure 3 consisting of four linear sides 3-1 that surround the active region 2 and arc-like parts that link these four sides (corner portions) 3-2, an increase in the width of the linear parts 3-1 of the edge termination structure 3 can be suppressed by creating a guard ring part with a wider width in the widened corner portions (arc-like parts) 3-2, as shown in FIG. 5A and FIG. 6A. A design that provides an edge termination structure 3 (that is, a device having a large active area) which is narrow overall is thus possible. By widening the arc diameter of the arc-like parts 3-2 and shifting the center of the arc toward the outer perimeter of the device, a plurality of ring-like field plates in which only the arc-like parts 3-2 are widened can be formed in the edge termination structure 3. The disposition of the plurality ring-like field plates with widened arc-like parts 3-2 will be described subsequently.

If a polysilicon film with a low resistance is employed as the first field plate 7, and an Al thin film that has been doped with minute amounts of silicon is employed as the second field plate 8-3, the existing power semiconductor process can be appropriated as is. The low resistance of a polysilicon film may be afforded through ion implantation or gas doping (the same as vapor doping). Al thin film that has been doped with minute amounts of silicon is generally used in the formation of a surface metal electrode 9 that is formed in the active region 2. Furthermore, it is possible to design an edge termination structure with a more stable characteristic because the film thickness of the first field plate 7 can be made thinner than the film thickness of the second field plate 8-3, so scatter in the etching of the first field plate 7 can be minimized.

If the first insulating film 5 is a thermally oxidized film and the second insulating film 6 is deposited by means of CVD (Chemical Vapor Deposition), existing power semiconductor processes can be appropriated as is. Further, if the second insulating film 6 is formed by thermally oxidizing the polysilicon film (polycrystalline silicon film) 7, there is no need to deposit the second insulating film 6, and an insulating film of uniform film thickness can be formed.

A specific embodiment of the present invention will now be described by using FIGS. 5, 6 and 8. FIGS. 5A and 5B and FIGS. 6A and 6B are, respectively, planar views A of the whole chip of the semiconductor device and enlarged planar views B of the edge termination structure 3-2 indicated by the dotted line circle Z in four corner portions located in the four corners of the edge termination structure 3. In addition, FIGS. 5B and 6B show adjoining corner portions of parts 3-2 of the edge termination structure in the four corners. The opposing corners of parts 3-2 of the edge termination structure in the four corners have the same constitution but the adjoining corners have a different constitution as shown in FIGS. 5B and 6B.

As shown in FIGS. 5B and 6B, among a plurality of p-type guard rings which are formed in the edge termination structure of the semiconductor device, a first field plate is on the surface of the odd-numbered guard rings starting from the inside and a second field plate is on the surface of the even-numbered guard rings starting from the inside. The first and second field plates of the surface have the same width in the linear portions of the edge termination structure but the width of the field plates where contact portions are provided is enlarged in the corner portions. That is, wide field plates having contact portions provided in the corner portions thereof and narrow field plates without contact portions are alternately provided.

Furthermore, as shown in FIG. 5B, of the plurality of p-type guard rings in the corner portions of the edge termination structure, only some of the odd-numbered p-type guard ring parts starting from the inside have a contact portion A which conductively connects the metal film field plate (second field plate) 8, polysilicon field plate (first field plate) 7, and the p-type guard ring small-area part. In FIG. 6B, a small-area contact portion A' which provides the same conductive connection is provided in only some of the even-numbered guard rings starting from the inside. That is, the constitution can be such that, in the withstand structure of the chip surface, a contact portion is provided for one set of opposing corner portions and this set of contact portions is alternately shifted through 90 degrees. Further, in both FIG. 5B and FIG. 6B, the curvature (radius of the arc) of the arc-like p-type guard ring part with the contact portion is such that the width of the arc-like field plate 3-3 or 3-4 of this section is made wider than that of the linear edge termination structure. This is because the center of the arc is shifted a little at a time toward the outside of the semiconductor device, and means that the contact portion is easily made. The width of the field plates 3-3 and 3-4 on the arc-like p-type guard ring parts without a contact portion is the same width as that of the linear portions.

Figure 7A:
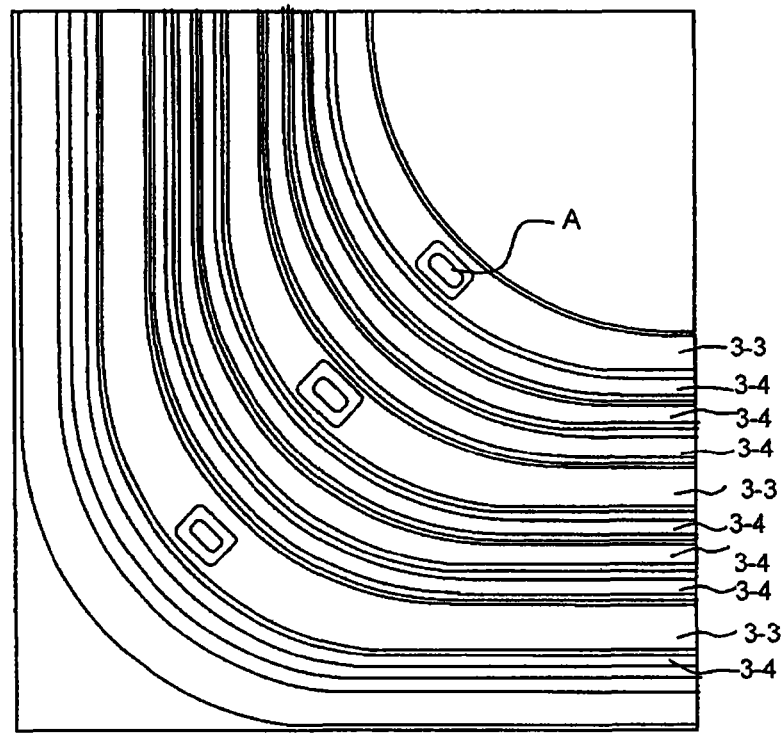
FIG. 7A is a (third) planar view of the withstand structure in the corner portion of the power semiconductor device of the present invention and FIG. 7B is a (fourth) planar view of the withstand structure in the corner portion of the power semiconductor device of the present invention.
Figure 7B:
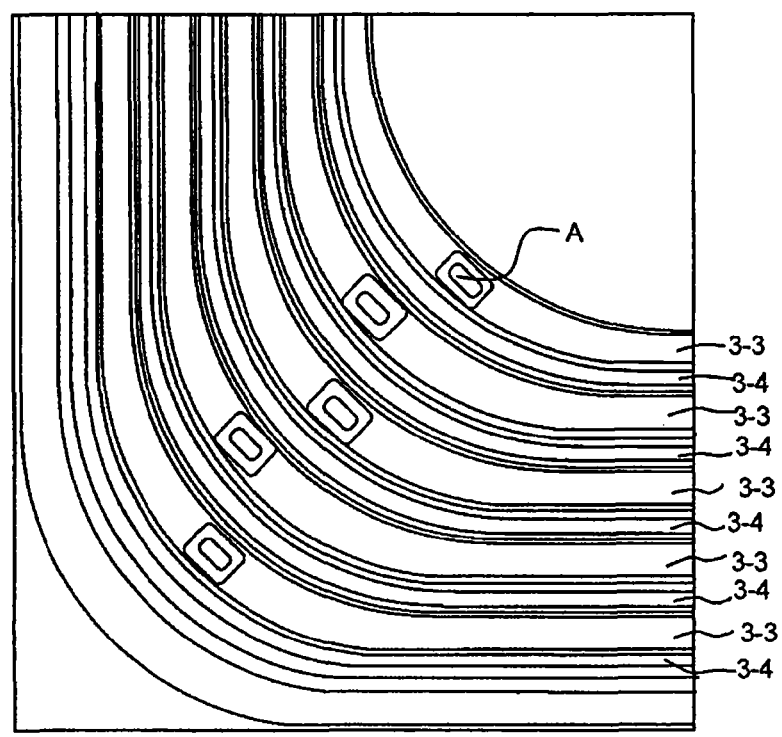
Figure 8:
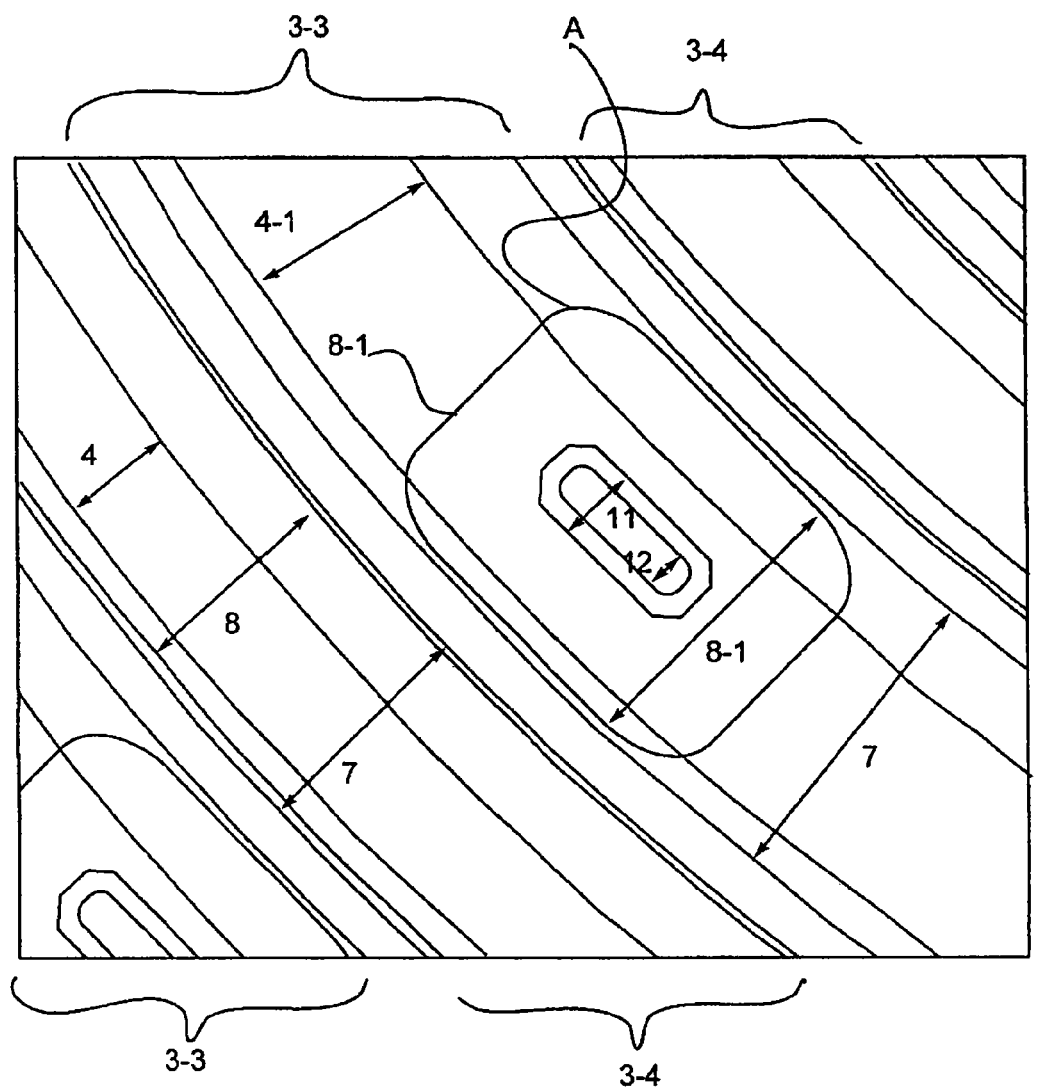
FIG. 8 is an enlarged planar view of the edge termination structure in the corner portion of the power semiconductor device of the present invention.

FIG. 7 is an embodiment example in which the disposition of the contact portions required for the wide arc-like p-type guard ring parts in the edge termination structure differs from that in FIGS. 5 and 6. FIG. 7A is a structure in which only one contact portion A is provided in the corner portion. In this case, because one contact portion A is provided shifted through 90 degrees at a time, three field plates 3-4 are then provided between the field plates 3-3 and the outer field plate 3-3 when one corner portion is viewed. Hence, the edge termination structure can be shortened further. FIG. 7B is an example in which the contact portions A in the corner portion are arranged in a zigzag shape, thereby enabling the edge termination structure to be shortened still further. In the embodiments of FIGS. 7A and 7B, a plurality of field plates without contact portions can be arranged between field plates with contact portions.

FIG. 6 is an enlarged planar view of a wide, arc-like first field plate part 3-3 which comprises the contact portion A shown framed by the dotted line square of FIG. 5B, and of a second field plate part 3-4 without a contact portion. The contact hole 11 of the punch-out of the interlayer insulating film (second insulating film) 6 and the contact hole 12 of the first field plate of polysilicon film must be covered by a metal film (second field plate) 8-1, similarly to the contact portion B in FIG. 3. However, because the metal film (second field plate) 8-1 is often formed by means of wet etching, the width must be afforded a margin of a few μm from the edge of the contact hole 11 in consideration of the etching accuracy. To widen the p-type guard ring width 4-1 and the second field plate width 8-1 of the part where the contact portion A is formed, the width 3-3 of this part is then greater than the width of the part without a contact portion. Hence, by providing a contact portion A formed on alternate p-type guard rings, an increase in the width of the edge termination structure in the corner portion can be suppressed and, a design for a semiconductor device in which the overall width of the edge termination structure is shortened is possible. This contrasts to forming contact portion A on all of the p-type guard rings of the corner portion of the edge termination structure as per the edge termination structure 3 of the present invention because a structure in which a contact portion is not formed in the linear parts is provided.

The metal film (second field plate) excluding the contact portions A and A' shown in FIGS. 5B and 6B serves to minimize the effect on the forward blocking voltage capability characteristic, due to external charge being attached to the insulating film, and has the effect of improving the long-term reliability of the forward blocking voltage capability.

The semiconductor device of the present invention will be described hereinbelow with a focus on the process for fabricating the edge termination structure by using the cross-sectional views of the edge termination structure representing a cross-section along line X-X' of FIG. 6B (FIGS. 9 to 12). Although a process that includes the formation of the active region is not described in detail, the edge termination structure of the present invention can be applied to wide devices such as gate-driven semiconductor devices and diode devices.

Figure 9:
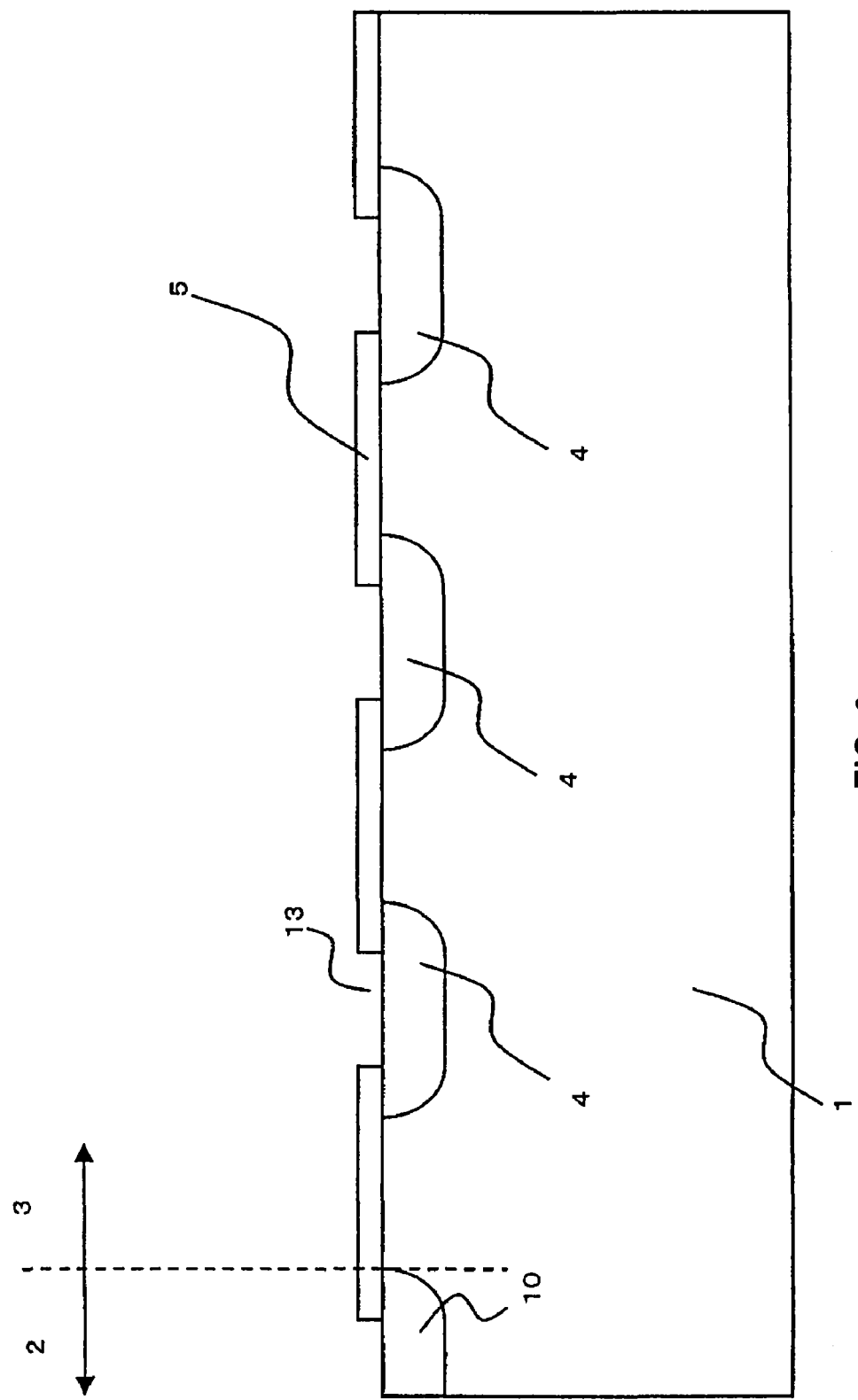
FIG. 9 is a (first) cross-sectional view along the line X-X' of the edge termination structure of FIG. 5B which illustrates the method of fabricating the power semiconductor device of the present invention.

As shown in FIG. 9, in order to form the p-type well region 10 of the active region 2 and the p-type guard ring 4 that is formed at the same time as region 10, a field oxide film 5 (first insulating film) is first formed on the semiconductor substrate 1 and an ion-implantation window 13 is formed by selectively etching the field oxide film 5 of the edge termination structure 3, whereupon ion implantation with a p-type impurity such as boron is performed to then produce the p-type guard ring 4 with a predetermined scatter depth by means of thermal scatter.

Figure 10:
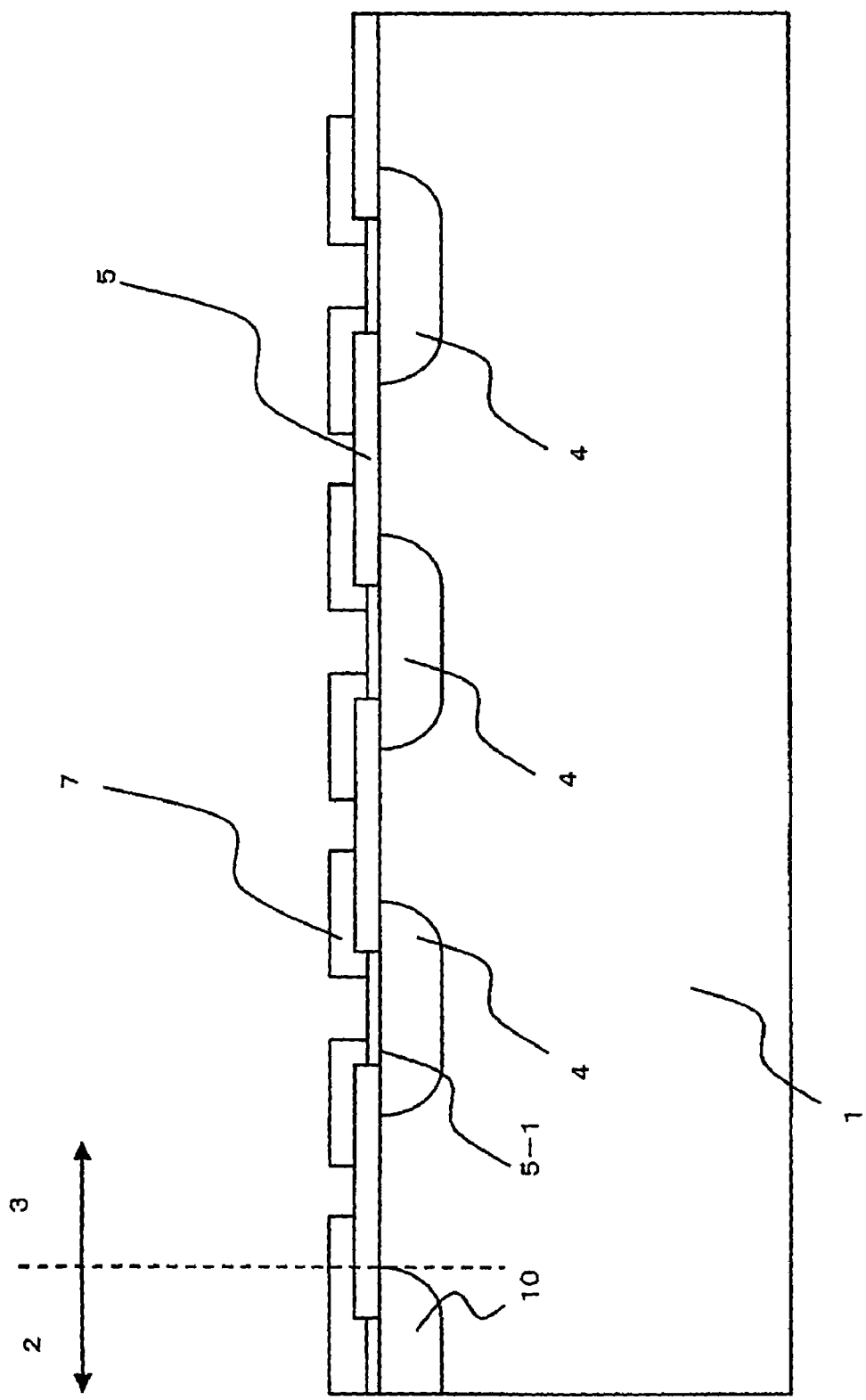
FIG. 10 is a (second) cross-sectional view along the line X-X' of the edge termination structure of FIG. 5B which shows the method of fabricating the power semiconductor device of the present invention.

As shown in FIG. 10, after forming a thin oxide film 5-1 on the order of 50 nm thick, a polysilicon film 7 (first field plate) is deposited. The thickness may be on the order of 0.5 μm. Using photolithography, the polysilicon film of the contact portion is removed by means of dry etching, and a first field plate 7 of a predetermined pattern is produced. When the polysilicon film of the contact part is dry-etched, the oxide film 5-1 below the polysilicon film serves as the etching stopper.

Figure 11:
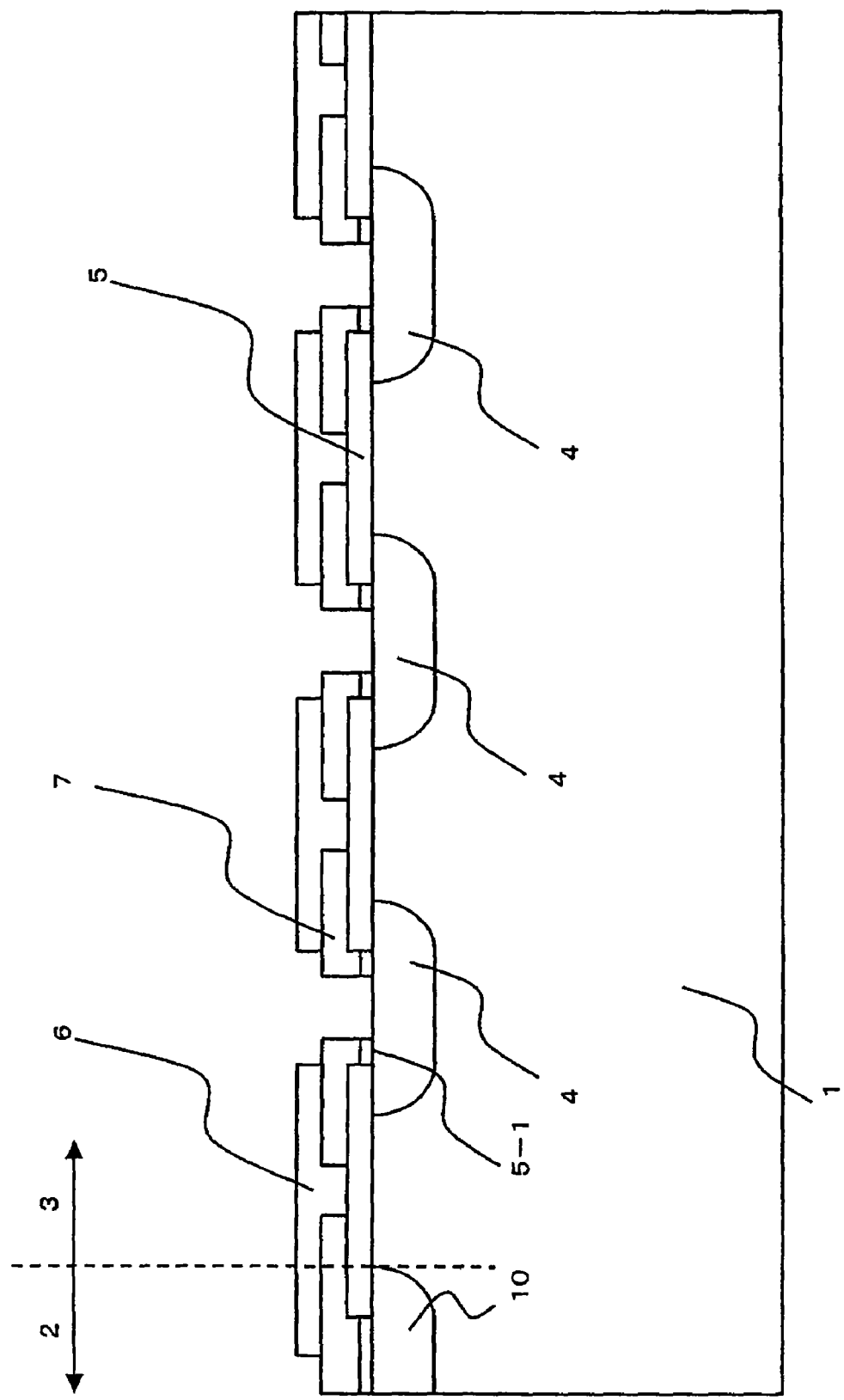
FIG. 11 is a (third) cross-sectional view along the line X-X' of the edge termination structure of FIG. 5B which shows the method of fabricating the power semiconductor device of the present invention.

As shown in FIG. 11, following the deposition of the inter-layer insulating film 6 (second insulating film) by means of CVD (Chemical Vapor Deposition), an opening in the interlayer insulating film 6 in an area that is greater than the open part of the polysilicon 7 of the contact part is formed through etching by means of photolithography. Thereupon, an oxide film 5-1 on the order of 50 nm thin in the open part of the polysilicon film 7 is etched at the same time to expose the surface of the p-type guard ring region 4.

Figure 12:
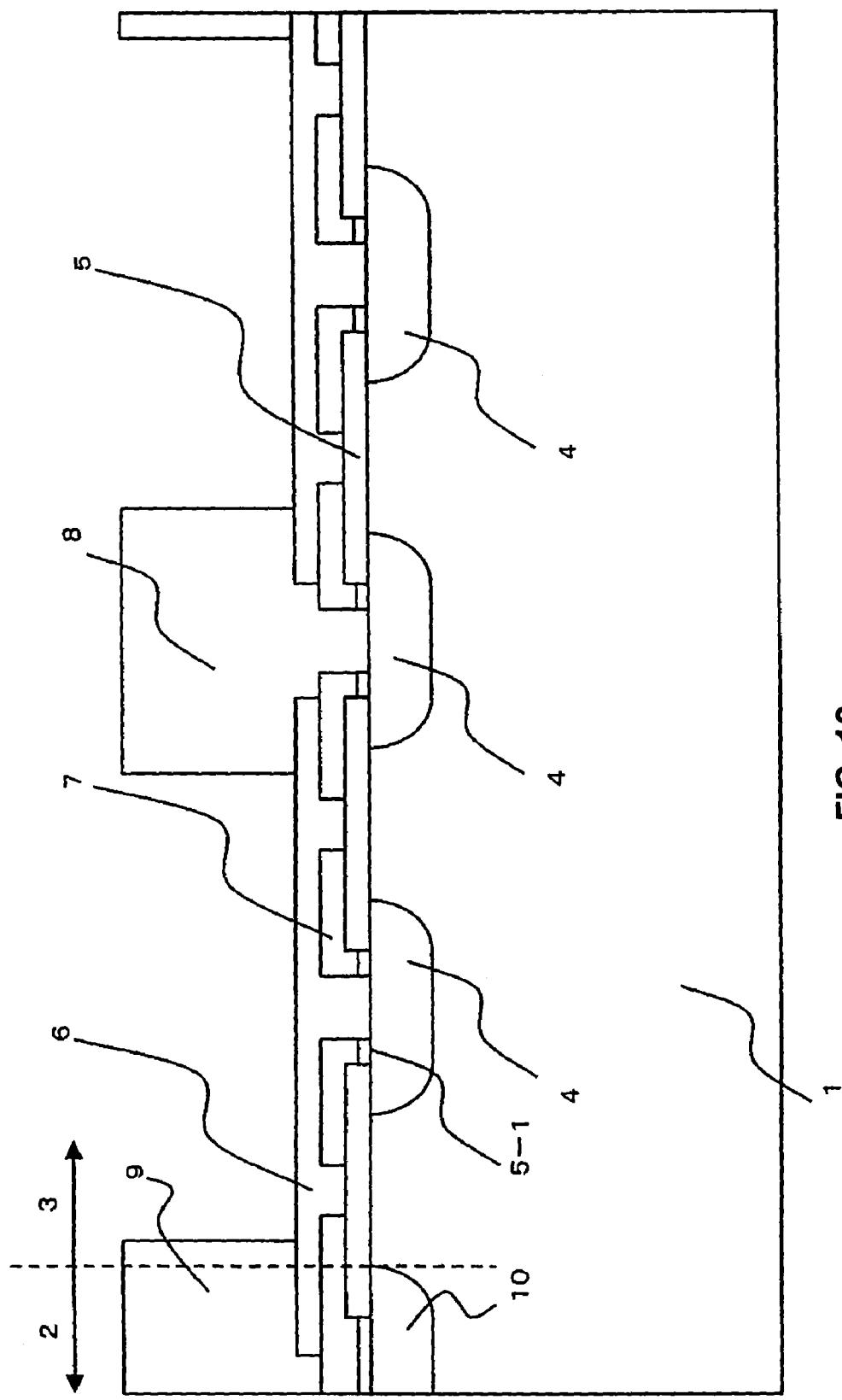
FIG. 12 is a (fourth) cross-sectional view along the line X-X' of the edge termination structure of FIG. 5B which shows the method of fabricating the power semiconductor device of the present invention.
Figure 13:
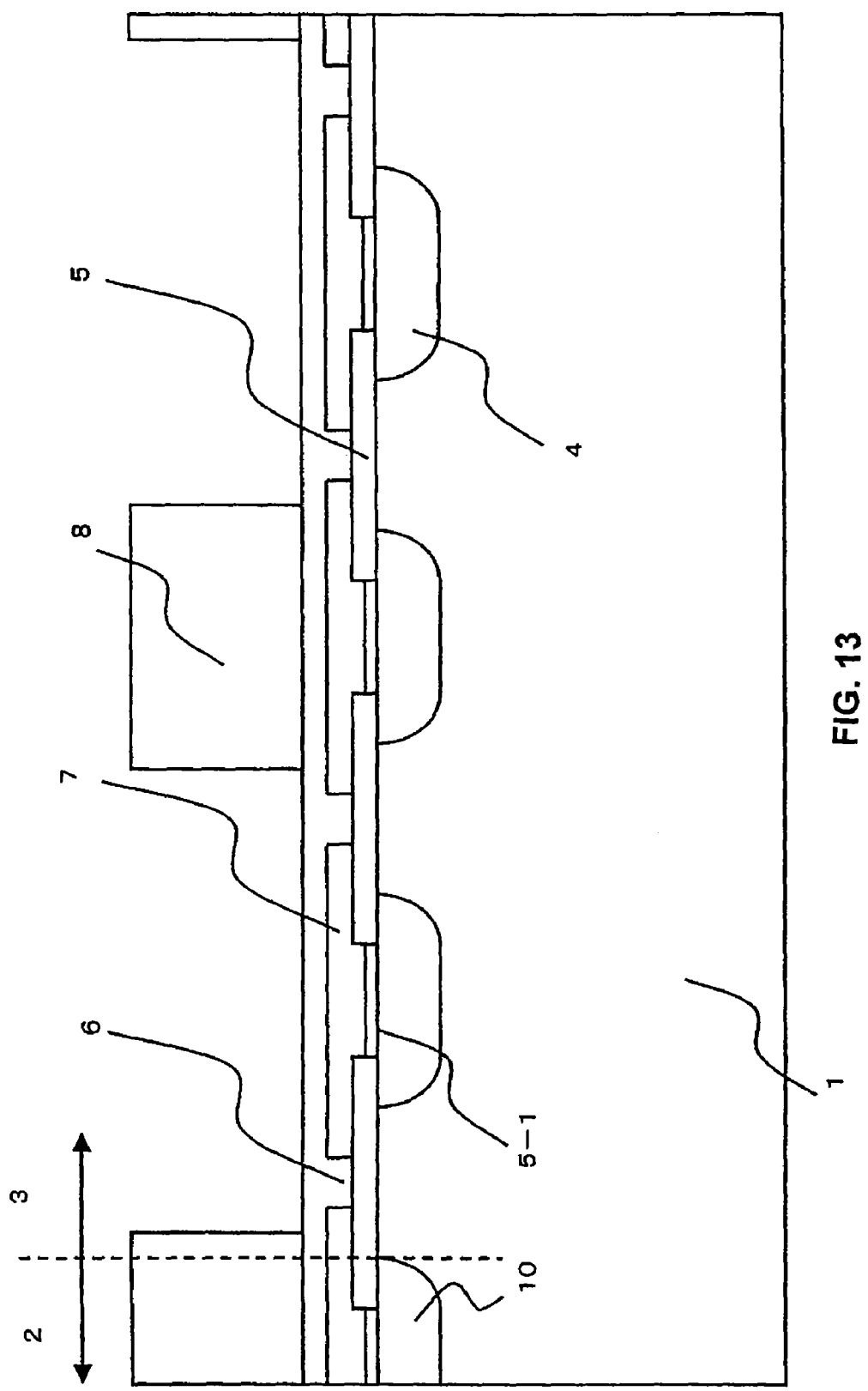
FIG. 13 is a cross-sectional view along the line Y-Y' of FIG. 6B which shows a non-contact portion of the edge termination structure in the corner portion of the power semiconductor device of the present invention.
Figure 14:
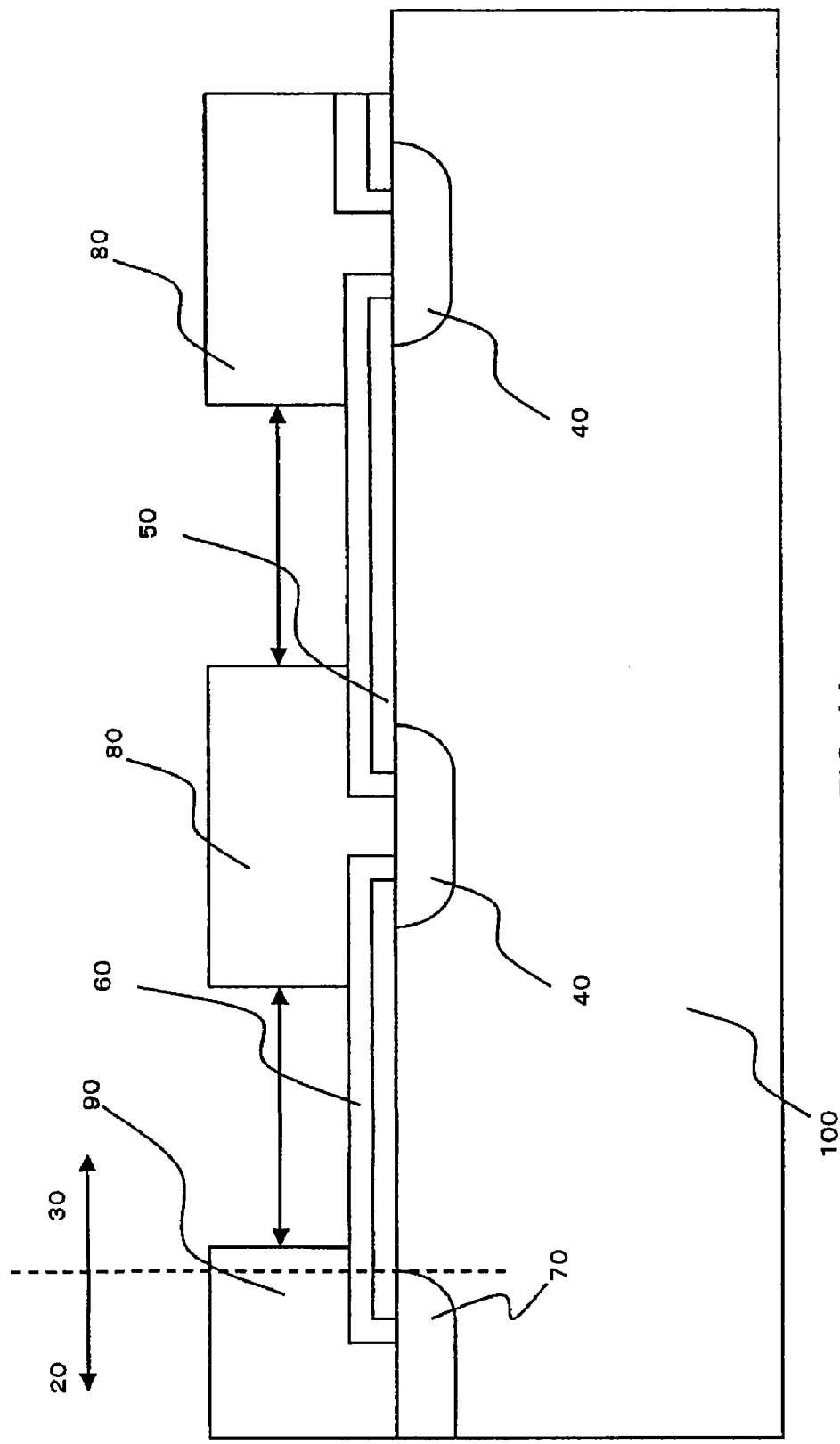
FIG. 14 is an essential part cross-sectional view which shows the edge termination structure of a conventional power semiconductor device.

As shown in FIG. 12, after sputtering is used to form a metal film of Al—Si or the like, which is formed at the same time as the formation of the metal electrode on the surface of the emitter electrode 9 of the active region 2, the metal film that is not required in photolithography is removed through etching to produce the desired second field plate 8.

This metal film (second field plate) 8 is thick and, therefore, wet etching is often used and the scatter of the side etching amount is large. Where the metal film 8 remains only inside the first field plate 7 made of polysilicon film (that is, the width of the second field plate 8 is smaller than the width of the first field plate 7), the main characteristics such as the forward blocking voltage capability are determined by a polysilicon film (first field plate) 7 for which scatter of the side etching amount is small. Hence, scatter of the characteristic is small. The metal film of the edge termination structure (second field plate) 8 does not affect the initial characteristic. Therefore, there is no problem with the device functions even when there is no metal film in parts other than the contact portions. However, by leaving the metal film in the form of a ring, it is possible to suppress the influence of charge from the outside, as was mentioned earlier.

Generally speaking, an insulating passivation film such as a polyimide resin or the like (not shown) is subsequently formed on the edge termination structure to complete the surface-side fabrication step. There is no window for etching the polysilicon film (first field plate 7) in regions other than the contact portions. Hence, the oxide film 5-1 below the polysilicon film 7 is not etched and enters an isolated state as per FIG. 8 which is a cross-sectional view along the line Y-Y' in FIG. 6. The semiconductor device of the present invention makes it possible to reduce the width of the edge termination structure for a conventional structure by 20% or more when compared with an edge termination structure with the same forward blocking voltage capability.

Figure 16:
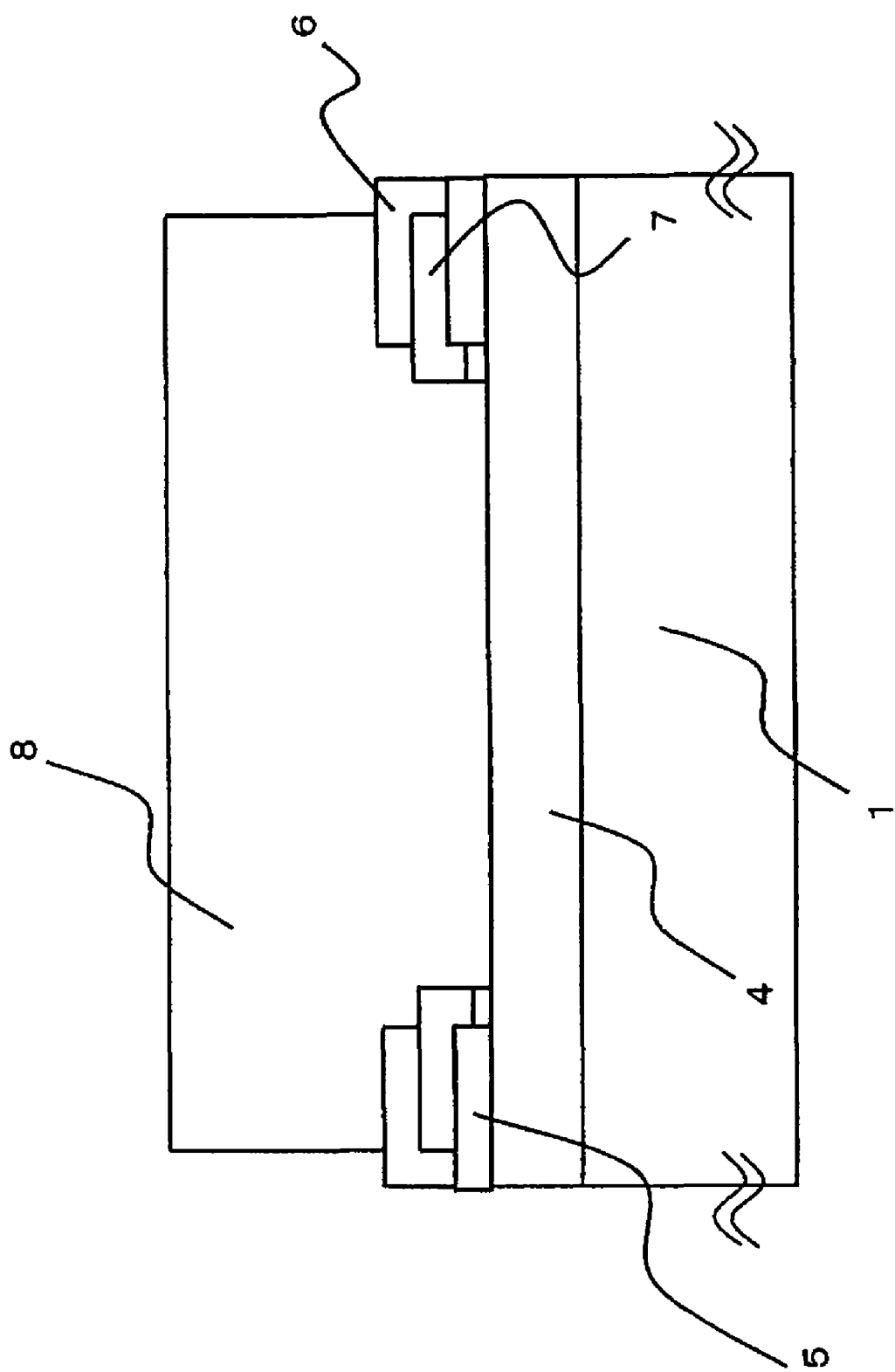
FIG. 16 is a (first) cross-sectional view along line D-D' of FIG. 15 of the present invention.

FIG. 15 shows an enlarged planar view which includes the location of a wide p-type guard ring of a portion of the edge termination structure having the same contact portion as the contact portion formed in FIG. 12. FIG. 16 shows a cross-sectional view along line D-D' in FIG. 15. According to FIG. 16, because the metal film (second field plate) 8, the polysilicon film (first field plate) 7 and the surface of the wide p-type guard ring region 4 are in conductive contact with one another, they are held at a mutually equal potential.

Figure 17:
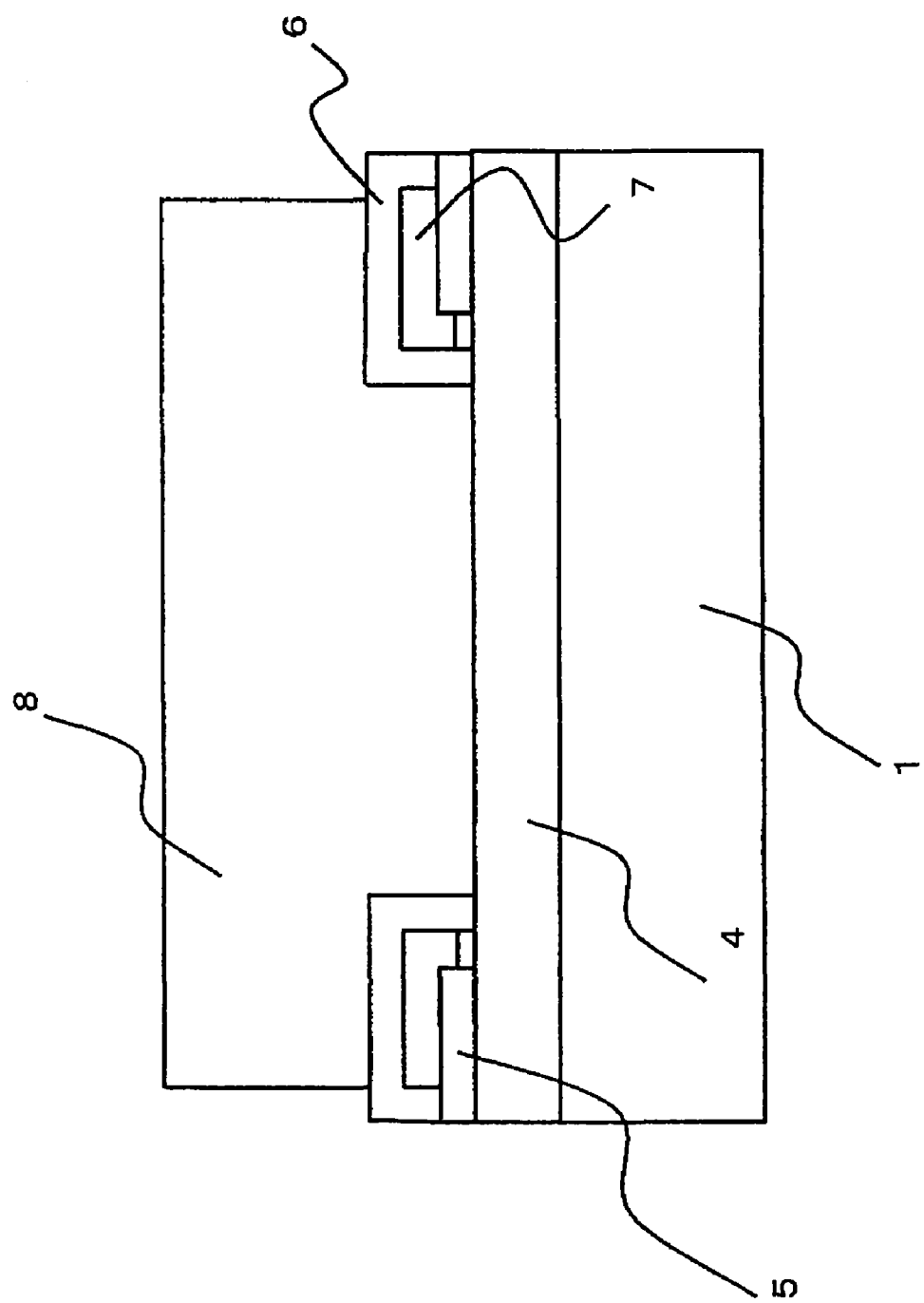
FIG. 17 is a (second) cross-sectional view along line D-D' of FIG. 15 of the present invention.

However, if the interlayer insulating film 6 on the polysilicon film 7 can be suitably removed by means of etching, conductive contact is made as mentioned above and the equal potential is suitably maintained. However, when an etching insufficiency occurs as a result of scatter of the etching process, there are cases where the polysilicon film 7 is not exposed and conductive contact is not suitably made as shown in FIG. 17 which is a cross-sectional view along the line D-D' in FIG. 15.

Figure 18:
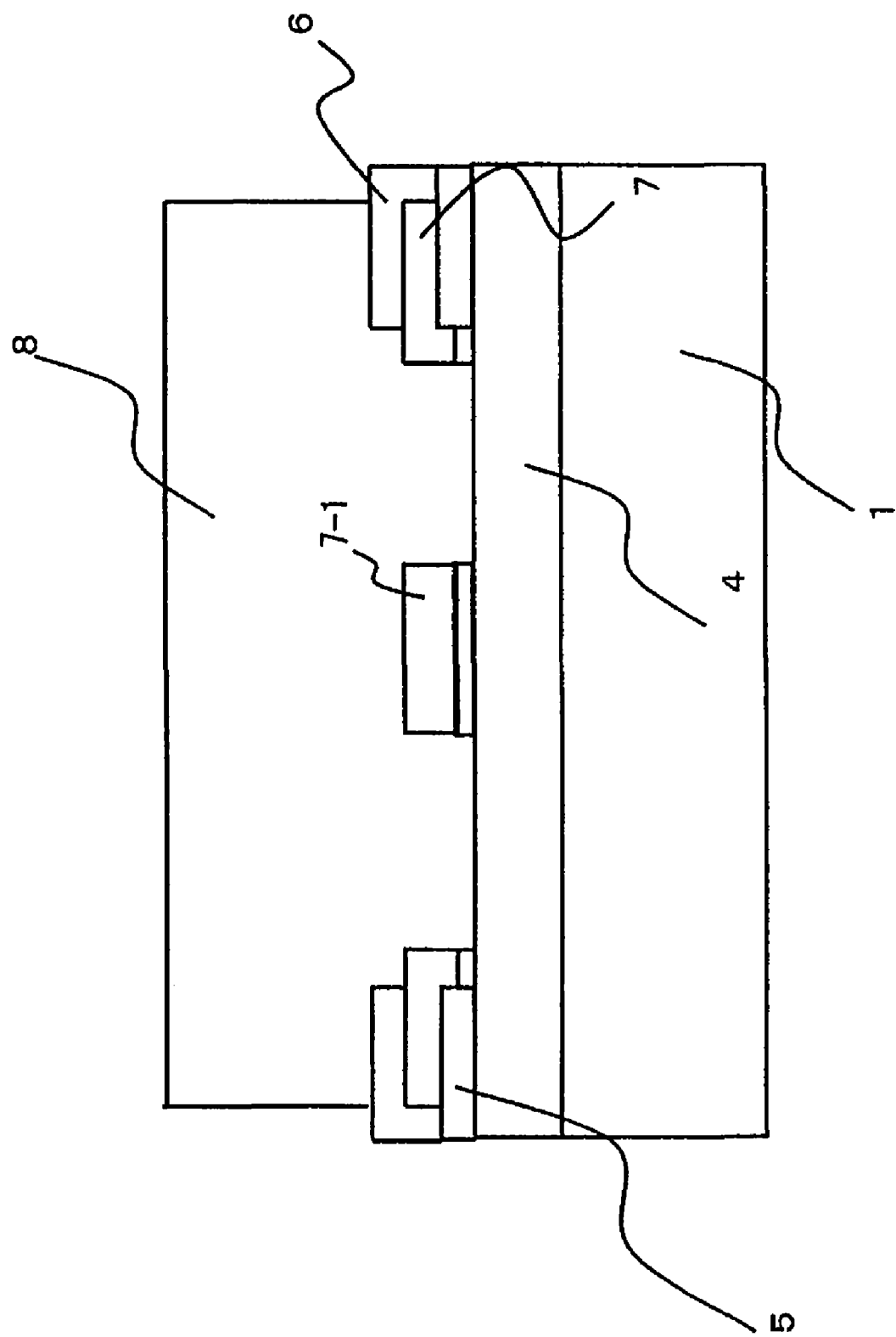
FIG. 18 is a (third) cross-sectional view along line D-D' of FIG. 15 of the present invention.
Figure 19:
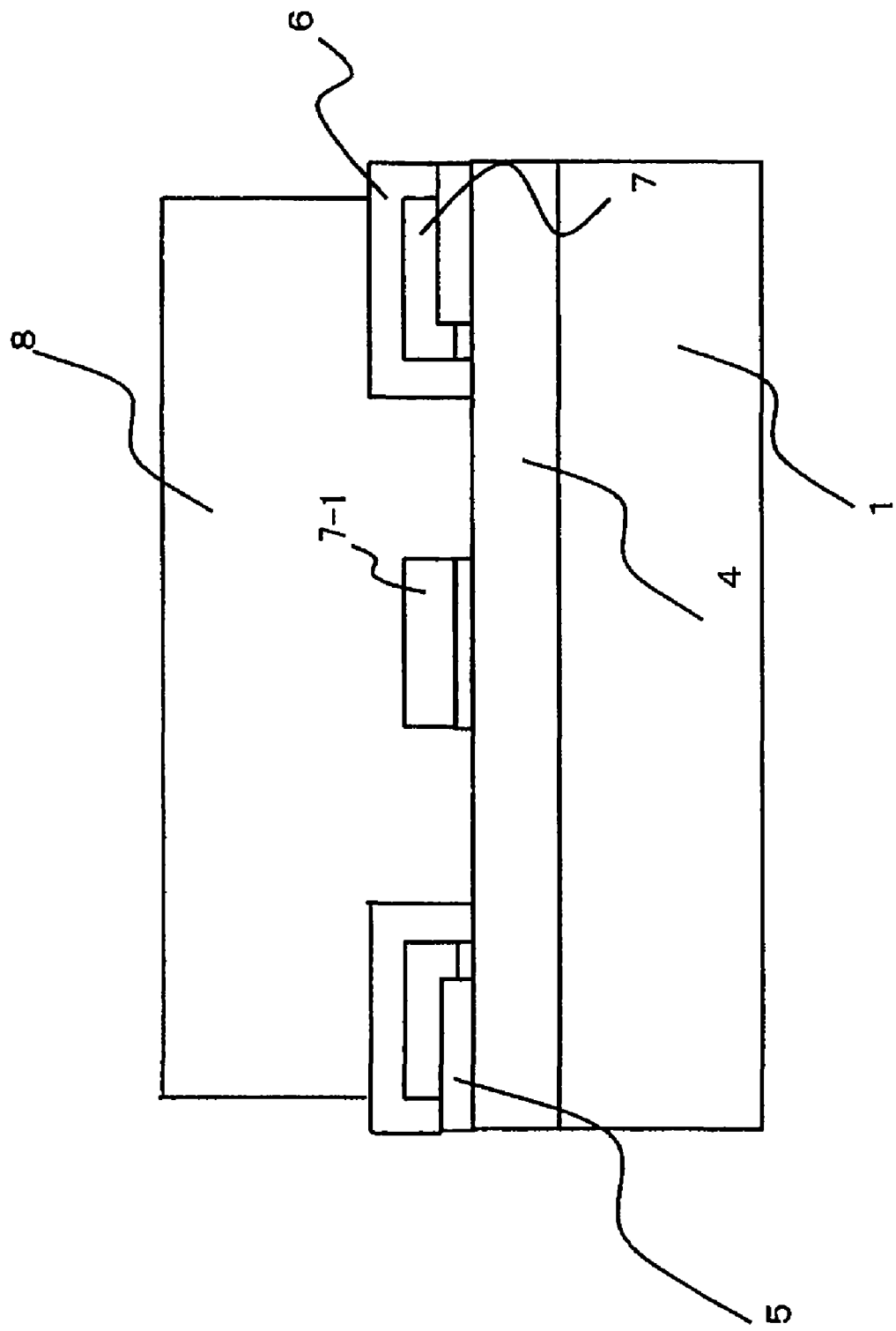
FIG. 19 is a (fourth) cross-sectional view along line D-D' of FIG. 15 of the present invention.

Therefore, as shown in FIG. 18, in the etching step in which the guard ring surface is exposed by etching inside the contact portion, the polysilicon film 7-1 without an interlayer insulating film is left at the center of the guard ring surface which should be exposed. The polysilicon film 7-1 appears to be separate in FIGS. 18 and 19. However, as shown in FIG. 15, the polysilicon film 7-1 is connected to the polysilicon film 7 at a point that is not shown in the cross-sectional view. FIGS. 18 and 19 are cross-sectional views along line D-D' in FIG. 15. By forming this polysilicon film 7-1 on the guard ring surface of the contact portion, the interlayer insulating film on the polysilicon film 7-1 at the center of the pattern is not readily affected. This is the case even if there is an insufficiency in the etching of the interlayer insulating film 6 as a result of scatter during pattern etching of the interlayer insulating film and the edge part of the etching pattern is readily affected by the etching insufficiency. Hence, an etching insufficiency does not readily arise and the conductive contact between the polysilicon film 7 and metal film 8 can be secured. As shown in FIG. 19, even in cases where there is an etching insufficiency in the edge part of the etching pattern, because the interlayer insulating film on the polysilicon film 7-1 is removed at the center of the pattern, the conductive contact is secured via this surface.

It is understood that the inventions described with reference to FIGS. 15 to 19 can have the same constitutional effects as those of the appended claims. Further, the invention has been described with respect to certain preferred embodiments thereof. It will be understood that modifications and variations are possible within the scope of the appended claims.

This application is based on, and claims priority to, Japanese Patent Application No. 2007-003579, filed on Jan. 11, 2007 and Japanese Patent Application No. 2007-207560, filed on Aug. 9, 2007. The disclosure of the priority application, in its entirety, including the drawings, claims, and the specification thereof, is incorporated herein by reference.

What is claimed is:

1. A power semiconductor device comprising:
a region of another conductivity type in a semiconductor substrate surface layer of a first conductivity type;
an active region having a metal electrode that contacts the region of another conductivity type; and
an edge termination structure that surrounds the active region, the edge termination structure having a plurality of ring-like other conductivity type guard rings, a first insulating film that covers a surface of the edge termination structure, and ring-like field plates each provided via the first insulating film atop the plurality of ring-like other conductivity type guard rings;
wherein the ring-like field plates include a first field plate comprising a conductive thin film and a second field plate comprising a metal film;
wherein the plurality of ring-like other conductivity type guard rings include a first ring-like other conductivity type guard ring on which the first field plate is provided via the first insulating film;
wherein a second ring-like other conductivity type guard ring on which a dual field plate comprising the first field plate and the second field plate which is provided via a second insulating film atop the first field plate is provided;
wherein a contact portion that establishes contact at the same potential between the plurality of ring-like other conductivity type guard rings, the first field plate, and the second field plate is provided in at least one location in each of the plurality of ring-like other conductivity type guard rings; and
wherein the contact portion is formed by a structure that covers the second field plate by embedding the second field plate in an etching hole that penetrates the second insulating film, the first field plate, and the first insulating film and reaches the surface of the ring-like other conductivity type guard rings such that the etching aperture diameter in the second insulating film is larger than the etching aperture diameter of the first field plate.

2. The power semiconductor device according to claim 1, wherein a width of the second field plate is smaller than the first field plate of the dual-stacked layer field plate structure in a direction that intersects the ring-like other conductivity type guard rings at right angles at the surface of the edge termination structure.

3. The power semiconductor device according to claim 1, wherein the contact portion is provided in corner portions of the edge termination structure, which surrounds the active region, and which comprises four linear sides and the corner portions which link the four sides in an arc shape.

4. The power semiconductor device according to claim 3, wherein the width of the arc-like part of the plurality of ring-like other conductivity type guard rings located in the corner portions of the edge termination structure is greater than the width of the four linear side parts of the edge termination structure.

5. The power semiconductor device according to claim 4, wherein the contact portion comprises either a first contact portion that covers the second field plate by embedding the second field plate in an etching hole that penetrates the second insulating film, the first field plate, and the first insulating film and reaches a surface of the ring-like other conductivity type guard rings such that the etching aperture diameter in the second insulating film is smaller than the etching aperture diameter of the first field plate, or a second contact portion which comprises the first insulating film, the first field plate, and the second insulating film on the surface of the ring-like other conductivity type guard rings, and which covers the second field plate by embedding the second field plate in an etching hole via which only the second insulating film is open.

6. The power semiconductor device according to claim 5, wherein the first field plate is formed by polycrystalline silicon with a low resistance afforded through ion implantation or gas doping.

7. The power semiconductor device according to claim 5, wherein the second field plate is formed by means of the same type of metal film as the metal electrode that is formed in the active region.

8. The power semiconductor device according to claim 5, wherein the first insulating film is a thermally oxidized film.

9. The power semiconductor device according to claim 5, wherein the second insulating film is an insulating film that is deposited by means of chemical vapor deposition.

10. The power semiconductor device according to claim 6, wherein the second insulating film is formed by oxidizing the first field plate that is formed from polycrystalline silicon.

11. The power semiconductor device according to claim 1, wherein a region in which the surface of the first field plate is exposed is provided in the center of the surface of the ring-like other conductivity type guard rings in the etching hole that is formed in the contact portion.

12. The power semiconductor device according to claim 11, wherein the contact portion is provided in the corner portion of the edge termination structure which surrounds the active region, and which comprises four linear sides and corner portions which link the four sides in an arc shape.

13. The power semiconductor device according to claim 12, wherein the width of the arc-like part of the plurality of ring-like other conductivity type guard rings located in the corner portions of the edge termination structure is greater than the width of the four linear side parts of the edge termination structure.

14. The power semiconductor device according to claim 13, wherein the contact portion comprises either a first contact portion that covers the second field plate by embedding the second field plate in an etching hole that penetrates the second insulating film, the first field plate, and the first insulating film and reaches a surface of the ring-like other conductivity type guard rings such that the etching aperture diameter in the second insulating film is smaller than the etching aperture diameter of the first field plate, or a second contact portion which comprises the first insulating film, the first field plate, and the second insulating film on the surface of the ring-like other conductivity type guard rings, and which covers the second field plate by embedding the second field plate in an etching hole via which only the second insulating film is open.

15. The power semiconductor device according to claim 14, wherein the first field plate is formed from polycrystalline silicon with a low resistance afforded through ion implantation or gas doping.

16. The power semiconductor device according to claim 14, wherein the second field plate is formed by means of the same type of metal film as the metal electrode that is formed in the active region.

17. The power semiconductor device according to claim 14, wherein the first insulating film is a thermally oxidized film.

18. The power semiconductor device according to claim 14, wherein the second insulating film is an insulating film that is deposited by means of chemical vapor deposition.

19. The power semiconductor device according to claim 14, wherein the second insulating film is formed by oxidizing the first field plate that is formed from polycrystalline silicon.

* * * * *